United States Patent
Tada et al.

(10) Patent No.: US 6,525,390 B2
(45) Date of Patent: Feb. 25, 2003

(54) MIS SEMICONDUCTOR DEVICE WITH LOW ON RESISTANCE AND HIGH BREAKDOWN VOLTAGE

(75) Inventors: Gen Tada, Nagano (JP); Akio Kitamura, Nagano (JP); Masaru Saito, Nagano (JP); Naoto Fujishima, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/793,833

(22) Filed: Feb. 27, 2001

(65) Prior Publication Data

US 2001/0048122 A1 Dec. 6, 2001

Related U.S. Application Data

(63) Continuation-in-part of application No. 09/579,031, filed on May 26, 2000, now abandoned.

(30) Foreign Application Priority Data

May 18, 2000 (JP) ..................... 2000-146703

(51) Int. Cl.[7] ............... H01L 29/72; H01L 29/76
(52) U.S. Cl. .................... 257/489; 257/490
(58) Field of Search .............. 257/298, 327, 257/329, 640, 649, 752–753, 758, 760, 296, 489–499; 438/212

(56) References Cited

U.S. PATENT DOCUMENTS

| | | | |
|---|---|---|---|
| 4,811,075 A | 3/1989 | Eklund | 357/46 |
| 5,382,825 A | 1/1995 | Neilson | 257/489 |
| 5,432,370 A | 7/1995 | Kitamura et al. | 257/339 |
| 5,475,258 A | 12/1995 | Kato et al. | 257/603 |
| 6,153,916 A | * 11/2000 | Roth et al. | 257/409 |
| 6,262,454 B1 | * 7/2001 | Legnani et al. | 257/355 |

FOREIGN PATENT DOCUMENTS

| | | | |
|---|---|---|---|
| JP | 04332173 A | * 11/1992 | 257/331 |
| WO | WO 94/16462 | 7/1994 | |

OTHER PUBLICATIONS

"High Voltage Driver for EL Display"; Takeo Fujimoto et al.; Sharp Technical Journal (vol. 20); Mar. 1981; pp. 57–62.

* cited by examiner

Primary Examiner—Minh Loan Tran
Assistant Examiner—Thomas L Dickey
(74) Attorney, Agent, or Firm—Rossi & Associates

(57) ABSTRACT

The invention provides a semiconductor device, manufactured with low manufacturing costs, that prevents the breakdown voltage from lowering. The semiconductor device according to the invention includes a p-type highly resistive semiconductor substrate; an n-type offset region in the surface portion of the substrate; a p-type base region in the surface portion of the substrate, the base region including an $n^+$-type source region in the surface portion thereof, the base region including a channel portion in the extended portion thereof extended between the source region and the n-type offset region; a p-type offset region in the surface portion of the n-type offset region, the potential of the p-type offset region being fixed at the source potential; an $n^+$-type drain region in the surface portion of the n-type offset region; a field oxide film on the p-type offset region; a gate oxide film on the channel portion of the base region; a gate electrode on the gate oxide film; a source electrode on source region; a drain electrode on the drain region; an interlayer film; a protection film; and a spiral polysilicon thin film on the field oxide film, one end of the thin film being connected to the drain electrode, another end of the thin film being connected to the source electrode, the thin film being formed of pn-diodes connected in series.

19 Claims, 21 Drawing Sheets

MIS SEMICONDUCTOR DEVICE WITH LOW ON RESISTANCE AND HIGH BREAKDOWN VOLTAGE

CROSS-REFERENCE TO RELATED APPLICATIONS

This application is a continuation-in-part application to pending U.S. patent application Ser. No. 09/579,031 filed May 26, 2000, now abandoned.

FIELD OF THE INVENTION

The present invention relates to semiconductor devices of MIS type (insulated gate type), such as a lateral power MOSFET, having a main current path in the lateral direction thereof. More specifically, the present invention relates to a semiconductor device structure that facilitates the stabilization of breakdown voltage of the semiconductor device and lowering the on-resistance thereof.

BACKGROUND

The so-called lateral power MOSFET, which has a main current path in the lateral direction thereof, is manufactured by planar diffusion from the surface of a semiconductor substrate. The lateral power MOSFET is characterized in that the lateral power MOSFET employs a reduced surface electric field (RESURF) technique and other such techniques to expand the depletion layer in the lateral direction thereof. This is caused by a reverse bias voltage applied between the source and the drain of the lateral power MOSFET, so that a certain breakdown voltage may be secured. Since the lateral power MOSFET is manufactured through a typical IC process, monolithic power IC's, having a control circuit and lateral power MOSFET's integrated therein, have been placed on the market.

FIG. 19 is a cross sectional view of a conventional n-channel lateral power MOSFET (hereinafter referred to as a "first conventional power MOSFET") disclosed in U.S. Pat. No. 4,811,075. Referring to FIG. 19, the first conventional lateral power MOSFET includes a highly resistive p-type substrate 101, having of resistivity is of about 125 ohm-cms; an n-type offset region 103 in the surface portion of p-type substrate 101; a p-type base region 102 in the surface portion of p-type substrate 101, base region 102 including (1) an $n^+$-type source region 105 in the surface portion thereof and (2) a channel portion in the extended portion thereof, extending between source region 105 and n-type offset region 103; a p-type offset region 104 in the surface portion of n-type offset region 103, the potential of the p-type offset region 104 being fixed at the source potential; an $n^+$-type drain region 106 in the surface portion of n-type offset region 103, the $n^+$-type drain region 106 being spaced apart from $n^+$-type source region 105 for about 80 micrometers; a field oxide film 108 on p-type offset region 104; a gate oxide film 107 on the channel portion of base region 102; a gate electrode 109 on gate oxide film 107; a source electrode 111 on source region 105; a drain electrode 112 on drain region 106; an interlayer film 113; and a protection film 114. The n-type offset region 103 is extended toward source region 105. A $p^+$-type region is disposed on base region 102 to secure ohmic contact for base region 102.

When a reverse bias voltage is applied between source electrode 111 and drain electrode 112, a depletion layer expands from the pn-junction between substrate 101 and n-type offset region 103 and another depletion layer from the pn-junction between n-type offset region 103 and p-type offset region 104. The first conventional power MOSFET is configured such that two depletion layers expand in a well-balanced manner and join each other to relax the electric field and, thereby, to secure a high breakdown voltage. Equipotential curves at an applied voltage of 750 V are shown in FIG. 19, at intervals of every 150 V.

Usually, actual lateral power MOSFET products are packaged in a plastic mold. Ionic particles (ions 105 or electric charges) in the plastic mold of a lateral power MOSFET cause unfavorable phenomena as described below.

When high voltage is applied between the source and the drain of the lateral power MOSFET packaged in a plastic mold, especially at high temperatures, positive ions 115a and positive electric charges in the plastic mold are attracted toward source electrode 111, and negative ions 115b and negative electric charges in the plastic mold are attracted toward drain electrode 112. As a result, in the portion to which the positive ions 115a and positive electric charges are attracted, protection film 114, interlayer film 113 and field oxide film 108 constitute a capacitor. On the substrate side thereof, negative electric charges 115c are induced, as shown in FIG. 20. The induced negative electric charges 115c turn a part of p-type offset region 104 to an n-type. In the portion to which the negative ions 115b and negative electric charges are attracted, positive electric charges 115d are induced, as shown in FIG. 20. The induced positive electric charges 115d thicken a portion of p-type offset region 104. Therefore, the original p-type offset region 104 deforms to a p-type offset region 104a. The deformation of the p-type offset region 104 causes an imbalance between the expanding depletion layers, a strong electric field locally, and lowers the breakdown voltage between the source and the drain.

In the first conventional lateral power MOSFET of FIG. 19, the main current path between the source and the drain is n-type offset region 103 in the ON-state. However, since p-type offset region 104 is formed in the surface portion of n-type offset region 103 to promote depletion at reverse bias voltage application, the main current path is pinched off easily (JFET effect) as the drain voltage rises and, thereby, the on-resistance is increased.

FIG. 21 is a cross sectional view showing a second conventional lateral power MOSFET and equipotential curves therein. The second conventional lateral power MOSFET has a structure that omits the p-type offset region 104 from the first conventional lateral power MOSFET of FIG. 19. Since there exits no p-type offset region in the second conventional lateral power MOSFET, the main current path thereof is hardly pinched off. As a result, the on-resistance thereof is suppressed at a low value. However, since a pn-junction is formed only between the p-type substrate and the n-type offset region, the n-type offset region is not easily depleted when a reverse bias voltage is applied. The breakdown voltage of the second conventional lateral power MOSFET is about 450 V, which is lower than that of the first conventional lateral power MOSFET.

Two problems of the conventional lateral power MOSFET's described above will now be summarized. First, when high voltage is applied at a high temperature between the source and the drain of the first conventional lateral power MOSFET packaged in a plastic mold, ions and electric charges in the plastic mold are attracted toward the source electrode and the drain electrode, and are localized thereon. The localized ions and electric charges induce electric charges of opposite polarities on the substrate side of the capacitor formed by the protection film and such other constituents. The induced electric charges deform the p-type offset region, cause an imbalance of depletion, and lower the breakdown voltage between the source and the drain.

Secondly, in the first conventional lateral power MOSFET, since the main current path in the ON-state is the n-type offset region between the p-type substrate and the p-type offset region, the main current path is easily pinched off as the drain voltage rises and the on-resistance is increased. In the second conventional lateral power MOSFET that omits the p-type offset region from the first conventional lateral power MOSFET, the n-type offset region is not easily depleted at reverse bias voltage application. Thus, the breakdown voltage is lowered.

In view of the foregoing, it is an object of the invention to provide a semiconductor device, manufactured at low manufacturing cost, that obviates the problems described above and prevents the lowering of the breakdown voltage.

SUMMARY OF THE INVENTION

According to a first aspect of the present invention, there is provided a semiconductor device having a MIS structure, the semiconductor device including: a semiconductor substrate of a first conductivity type; a base region of the first conductivity type formed selectively in the surface portion of the semiconductor substrate; a lightly doped offset region of a second conductivity type formed selectively in the surface portion of the semiconductor substrate; a heavily doped source region of the second conductivity type formed selectively in the surface portion of the base region; a heavily doped drain region of the second conductivity type formed selectively in the surface portion of the offset region; a gate insulation film at least on the extended portion of the base region extended between the source region and the offset region; a gate electrode on the gate insulation film; a source electrode on the source region; a drain electrode on the drain region; a field insulation film formed selectively on the offset region; and a spiral thin film on the field insulation film. An end of the spiral thin film is connected to the drain electrode, and another end of the spiral thin film is connected to the source electrode. The spiral thin film is formed of multiple pn-diodes connected in series and surrounds the drain electrode.

According to a second aspect of the invention, there is provided a semiconductor device having a MIS structure, the semiconductor device including: a semiconductor substrate of a first conductivity type; a lightly doped offset region of a second conductivity type formed selectively in the surface portion of the semiconductor substrate; a base region of the first conductivity type formed selectively in the surface portion of the offset region; a heavily doped drain region of the second conductivity type formed selectively in the surface portion of the offset region, the drain region being spaced apart from the base region; a source region of the second conductivity type formed selectively in the surface portion of the base region; a gate insulation film at least on the extended portion of the base region extended between the source region and the offset region; a gate electrode on the gate insulation film; a source electrode on the source region; a drain electrode on the drain region; a field insulation film formed selectively on the offset region; and a spiral thin film on the field insulation film. One end of the spiral thin film is connected to the drain electrode, and another end of the spiral thin film is connected to the source electrode. The spiral thin film being formed of multiple pn-diodes connected in series and surrounds the drain electrode.

Advantageously, the semiconductor device further includes a counter-doped region in the surface portion of the offset region. The counter-doped region is formed by diffusing impurities of the first conductivity type to the surface portion of the offset region at such a concentration that the counter-doped region is of the second conductivity type.

Also advantageously, the semiconductor device further includes a counter-doped region in the surface portion of the offset region between the source region and the drain region. The counter-doped region is formed by diffusing impurities of the first conductivity type to the surface portion of the offset region at such a concentration that the counter-doped region is of the second conductivity type.

Further still, the semiconductor device advantageously includes an offset region of the first conductivity type formed selectively in the surface portion of the offset region of the second conductivity type. Still further, the semiconductor device advantageously includes an offset region of the first conductivity type formed selectively in the surface portion of the offset region of the second conductivity type between the source region and the drain region.

Preferably, the semiconductor device includes a resistor thin film replacing the thin film formed of multiple pn-diodes connected in series. Also, preferably, one or more turns of the spiral thin film are between the drain electrode and the source electrode. Further, the spiral thin film is preferably made of polysilicon. Further still, the product of the reverse blocking voltage value of one of the pn-diodes and the number of the pn-diodes is preferably larger than the breakdown voltage between the source region and the drain region of the semiconductor device.

In a particularly preferred embodiment, the semiconductor device further includes one or more spiral thin films. Also preferably, the spiral thin film includes a thin film resistor branching from the midpoint of series connection of the pn-diodes, the thin film resistor being formed along the drain electrode and the source electrode. Preferably, the thin film resistor employs the p-type layer or the n-type layer of the pn-diodes. The spiral polysilicon thin film on the field plate between the source and drain electrodes may be formed of multiple pn-diodes connected in series, a highly resistive thin film of more than several M-ohms, or multiple pn-diodes and a highly resistive thin film. The semiconductor device may include one or more spiral polysilicon thin films.

When a reverse bias voltage is applied between the source and the drain, the reverse saturation current of the pn-diodes or a resistance current flows through the spiral thin film and, as a result, an almost uniform potential gradient is obtained across the thin film.

In a practical device, the thin film, arranged on a field oxide plate, having a certain width and spirally wound with a certain spacing between adjacent turns, works as a field plate, the local potential thereof changing with every turn. Since the local potential of the substrate beneath a specific position of the spiral thin film is forced to close to the local potential of the spiral thin film at the specific position due to the field plate effect, the potential gradient across the depletion layer is almost uniform. Moreover, since the spiral thin film exhibits shield effects against disturbances such as ions and electric charges in the plastic mold of the semiconductor device, deviations of the breakdown voltage are significantly reduced, even when high voltage is applied at a high temperature. Thus, a very reliable semiconductor device is obtained.

Since the spiral polysilicon thin film works as a field plate, the impurity concentration in the p-type offset region, which increases on-resistance, may be lower than the optimum concentration, in that a certain breakdown voltage is secured without providing the polysilicon thin film. FIG. 22 shows a set of curves relating the breakdown voltage and the on-resistance with the p-type impurity concentration in the surface portion of the n-type offset region, in which the n-type impurity concentration is $3 \times 10^{16} cm^{-3}$. FIG. 23 shows a set of curves relating the breakdown voltage and the on-resistance with the p-type impurity concentration in the surface portion of the n-type offset region, in which the n-type impurity concentration is $7 \times 10^{15} cm^{-3}$. In these figures, "Bvdss" represents the breakdown voltage, and "Ron" represents the on-resistance. "Bvdss(w/o PF)" represents the breakdown voltage of the conventional device not including any spiral thin film. "Bvdss(w PF)" represents the breakdown voltage of the device including a spiral thin film according to the invention.

FIG. 23 indicates that a desired breakdown voltage may be obtained by diffusing p-type impurities to the surface portion of the n-type offset region at a concentration that does not turn the surface portion of the n-type offset region into a p-type. Moreover, when the n-type offset region is doped more lightly and shallower (the case shown in FIG. 23), a desired breakdown voltage is secured without providing any p-type offset region. In other words, the spiral polysilicon thin film facilitates decreasing the concentration of the p-type offset region, which increases the on-resistance, substantially reducing the resistance of the p-type offset region and producing a semiconductor device exhibiting low on-resistance.

The saturation current of the pn-diodes and/or the current flowing through the thin film resistor, caused when a reverse bias voltage is applied between the source electrode and the drain electrode, facilitates obtaining an almost uniform potential gradient across the spiral thin film formed on the field oxide film between the source electrode and the drain electrode. The local potential of the substrate is equalized with the local potential of the spiral thin film, thus producing a stable breakdown voltage.

Moreover, since the spiral thin film exhibits shield effects against disturbances such as ions and electric charges in the plastic mold of the semiconductor device, deviations of the breakdown voltage hardly occur, even when high voltage is applied at a high temperature. Thus, a very reliable semiconductor device is obtained. Since the spiral polysilicon thin film works as a field plate, the impurity concentration in the p-type offset region, which increases on-resistance, may be lower than the optimum concentration. Under these conditions, a certain breakdown voltage is secured without needing to provide the polysilicon thin film.

Since the resistance of the n-type offset region, which provides a main current path in the ON-state of the semiconductor device, is substantially reduced, the on-resistance of the semiconductor device is reduced. In detail, FIGS. 22 and 23 indicate that the onresistance may be reduced by about 40%. Since the area of the power MOSFET may be reduced by about 40% for the same on-resistance values, the cost of the semiconductor device is greatly reduced.

According to a third aspect of the invention, there is provided a semiconductor device having a MIS structure, the semiconductor device including: a semiconductor substrate of a first conductivity type; a base region of the first conductivity type formed selectively in the surface portion of the semiconductor substrate; a lightly doped offset region of a second conductivity type formed selectively in the surface portion of the semiconductor substrate; a heavily doped source region of the second conductivity type formed selectively in the surface portion of the base region; a heavily doped drain region of the second conductivity type formed selectively in the surface portion of the offset region; a gate insulation film at least on the extended portion of the base region extended between the source region and the offset region; a gate electrode on the gate insulation film; a source electrode on the source region; a drain electrode on the drain region; a field insulation film formed selectively on the offset region; a first thin film formed of pn-diodes connected in series; a first thin resistive layer; and a second thin film formed of pn-diodes connected in series, with the source electrode surrounding the drain electrode or the drain electrode surrounding the source electrode. One end of the first thin film is connected to the source electrode, and another end is connected to an end of the first thin resistive layer. One end of the first thin resistive layer is connected to an end of the second thin film, and another end of the second thin film is connected to the drain electrode.

Advantageously, the semiconductor device further includes an interlayer insulation film and connection holes, with the interlayer insulation film being on the first thin film and the second thin film; the first thin resistive layer being on the interlayer insulation film; the connection holes being bored through the interlayer insulation film on intermediate ones of the pn-diodes in the first thin film and the second thin film; the intermediate ones of the pn-diodes in the first thin film and the second thin film being connected to the first thin resistive layer through the connection holes; and the first thin resistive layer being formed along the source electrode or the drain electrode.

Also advantageously, the source electrode includes an extended portion extended from the source region, and the drain electrode includes an extended portion extended from the drain region. The extended portions of the source electrode and the drain electrode are preferably above the first thin resistive layer. One end of the first thin film is preferably connected to the source electrode in the vicinity of the source region, such as a gate electrode, and an end of the second thin film is connected to the drain electrode in the vicinity of the drain region.

Advantageously, the first thin resistive layer is made of polysilicon with low electrical resistance. Also advantageously, the first thin resistive layer is an aluminum resistive film.

Preferably, the semiconductor device further includes an interlayer insulation film and a second thin resistive layer, with the interlayer insulation film being on the first thin film, the second thin film, and the first thin resistive layer. The source electrode and the drain electrode are preferably on the interlayer insulation film, and the second thin resistive layer is preferably in the portion of the interlayer insulation film between the source electrode and the drain electrode.

Further, the source electrode advantageously includes an extended portion extending from the source region; the drain electrode includes an extended portion extending from the drain region; and the extended portions of the source electrode and the drain electrode are above the second thin resistive layer. One end of the first thin film is connected to the source electrode in the vicinity of the source region, such as a gate electrode, and an end of the second thin film is connected to the drain electrode in the vicinity of the drain region.

Further still, the semiconductor device advantageously includes connection holes, through which the second thin resistive layer is connected to the first thin film and the second thin film or to the first thin resistive layer.

Still further, the side face of the source electrode preferably has straight sections and semicircular sections, and the side face of the drain electrode has straight sections and semicircular sections. The straight sections of the source electrode and the straight sections of the drain electrode are advantageously facing opposite each other, and the semicircular sections of the source electrode and the semicircular sections of the drain electrode are facing opposite each other. The first thin resistive layer preferably has a semicircular section between the semicircular section of the source electrode and the semicircular section of the drain electrode, and the width of the semicircular section of the first thin resistive layer in the central portion thereof is preferably wider than the width of the semicircular section of the first thin resistive layer in the end portions thereof.

According to a fourth aspect of the invention, there is provided a semiconductor device including: a semiconductor substrate of a first conductivity type; a base region of the first conductivity type formed selectively in the surface portion of the semiconductor substrate; a lightly doped offset region of a second conductivity type formed selectively in the surface portion of the semiconductor substrate; a heavily doped source region of the second conductivity type formed selectively in the surface portion of the base region; a heavily doped drain region of the second conductivity type formed selectively in the surface portion of the offset region; a gate insulation film at least on the extended portion of the base region extending between the source region and the offset region; a gate electrode on the gate insulation film; a source electrode on the source region; a drain electrode on the drain region; a field insulation film formed selectively on the offset region; a first thin film formed of pn-diodes connected in series; a thin resistive layer; and a second thin film formed of pn-diodes connected in series. Preferably, the source electrode surrounds the drain electrode, or the drain electrode surrounds the source electrode. The thin resistive layer is preferably between the source electrode and drain electrode, the thin resistive layer turning around along the source electrode and drain electrode. An end of the first thin film is preferably connected to the source electrode, and another end of the first thin film is connected to a first location of the thin resistive layer. An end of the second thin film is preferably connected to a second location of the thin resistive layer, and another end of the second thin film being connected to the drain electrode.

Advantageously, the side face of the source electrode has straight sections and semicircular sections; the side face of the drain electrode has straight sections and semicircular sections; the thin resistive layer has straight sections and semicircular sections; the straight sections of the source electrode and the straight sections of the drain electrode are facing opposite each other; the semicircular sections of the source electrode and the semicircular sections of the drain electrode are facing opposite each other; the semicircular section of the thin resistive layer is between the semicircular section of the source electrode and the semicircular section of the drain electrode; and the width of the semicircular sections of the thin resistive layer in the central portion thereof is wider than the width of the semicircular sections of the thin resistive layer in the end portions thereof.

Advantageously, the thin resistive layer is made of polysilicon with low electrical resistance. Also advantageously, the thin resistive layer is an aluminum resistive film.

The parasitic capacitance is reduced by disposing a thin resistive layer above the thin film of pn-diodes and by connecting the thin resistive layer to the intermediate one of the pn-diodes connected in series. The central portion of the thin resistive layer is widened more than the end portion to suppress the influence of ions in a plastic mold. The undesirable influence of these ions is greatly reduced by extending the source electrode and the drain electrode above the thin resistive layer.

BRIEF DESCRIPTION OF THE DRAWING FIGURES

DETAILED DESCRIPTION OF THE PREFERRED EMBODIMENTS OF THE INVENTION

Figure 1:
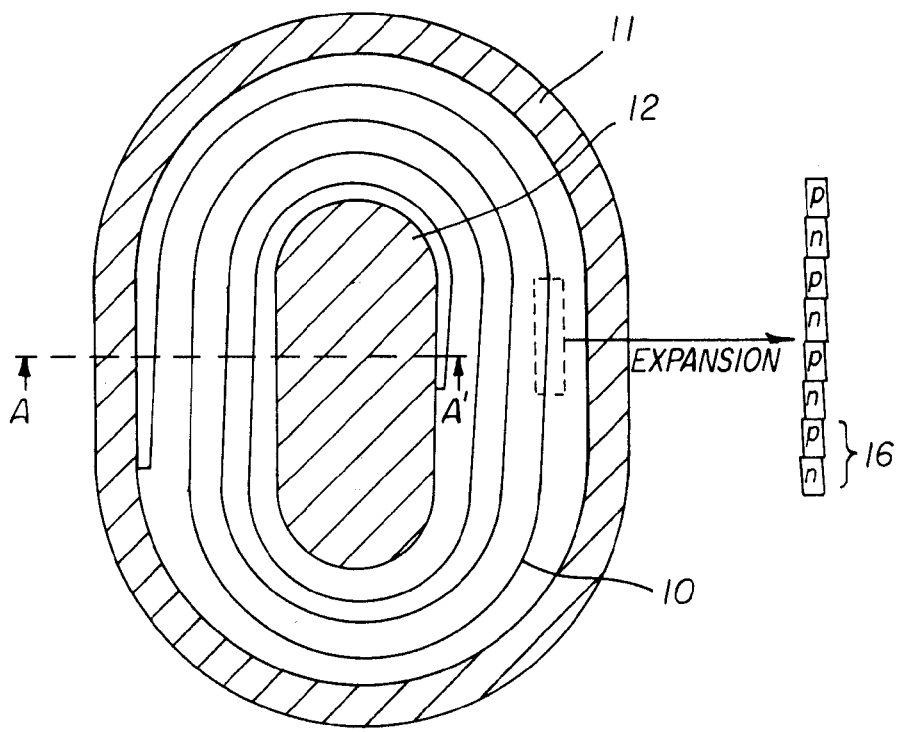
FIG. 1 is a top plan view of a semiconductor device according to a first embodiment of the invention.
Figure 2:
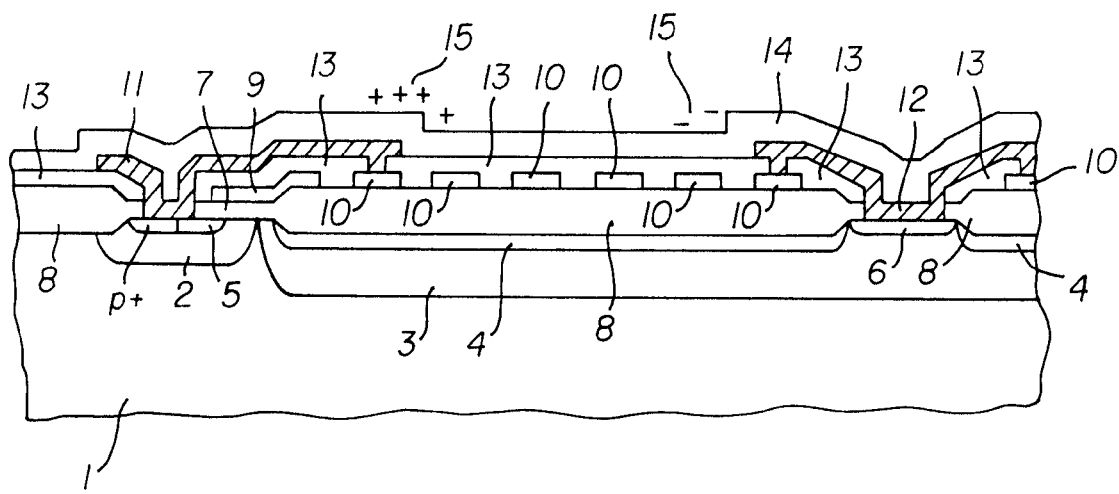
FIG. 2 is a cross section along A–A' of FIG. 1.

The invention will be explained hereinafter with reference to the accompanying drawings, which illustrate the preferred embodiments of the invention. FIG. 1 is a top plan view of a semiconductor device according to a first embodiment of the invention. FIG. 2 is a cross section along A–A' of FIG. 1.

Referring to FIGS. 1 and 2, the semiconductor device according to the first embodiment includes: a highly resistive p-type substrate 1, the resistivity thereof is around 125 ohms/sqaure; an n-type offset region 3 in the surface portion of substrate 1; a p-type base region 2 in the surface portion of substrate 1, base region 2 including an $n^+$-type source region 5 in the surface portion thereof, base region 2 including a channel portion in the extended portion thereof extending between source region 5 and n-type offset region 3; a p-type offset region 4 in the surface portion of n-type offset region 3, the potential of p-type offset region 4 being fixed at the source potential; an $n^+$-type drain region 6 in the surface portion of n-type offset region 3, $n^+$-type drain region 6 being spaced apart from $n^+$-type source region 5 for about micrometers; a field oxide film 8 on p-type offset region 4; a gate oxide film 7 on the channel portion of base region 2; a gate electrode 9 on gate oxide film 7; a source electrode 11 on source region 5; a drain electrode 12 on drain region 6; an interlayer film 13; and a protection film 14. The n-type offset region 3 is extended toward source region 5. Ions 15 (or electric charges) shown in FIG. 2 are in the plastic mold of the semiconductor device. A p+-type region is disposed on base region 2 to secure ohmic contact for base region 2.

A spiral polysilicon thin film 10 is arranged on field oxide film 8. An end of thin film 10 is connected to drain electrode 12 and another end thereof to source electrode 11. As shown in the enlarged drawing of FIG. 1, thin film 10 includes about 200 pn-diodes 16 connected in series. Since the breakdown voltage of one pn-diode 16 is about 5 V, the breakdown voltage of thin film 10 is 5×200=1000 V in total.

As shown in FIG. 2, six cross sections of spiral thin film 10 appear at a certain interval on field oxide film 8 in some cross sections. When a reverse bias voltage (750 V in this case) is applied between the source and the drain, the source is biased at 0 V and the drain at 750 V. A voltage difference of about 150 V is caused across one turn of spiral thin film 10 due to the voltage drop caused by the saturation current of the pn-diodes in spiral thin film 10 arranged between the source and the drain.

Figure 13:
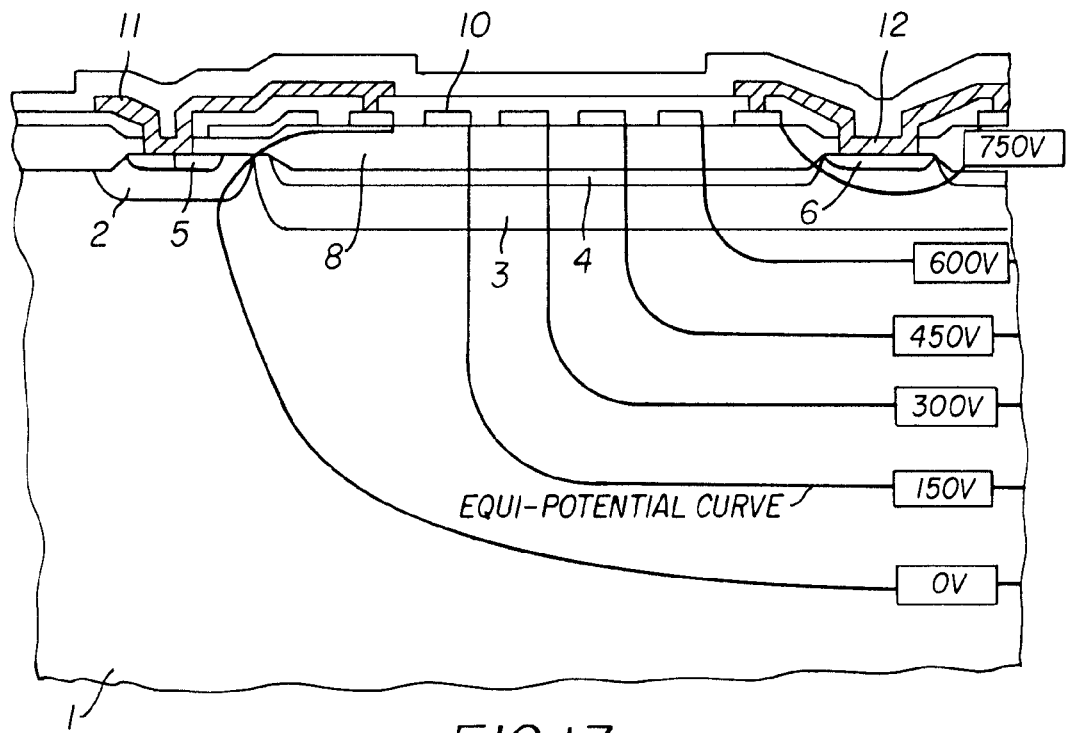
FIG. 13 is a cross sectional view showing equipotential curves across the semiconductor device according to the first embodiment for the reverse bias voltage of 750 V applied between the source and the drain.

FIG. 13 is a cross sectional view showing equipotential curves across the semiconductor device, according to the first embodiment, for the reverse bias voltage of 750 V applied between the source and the drain. In the figure, the equipotential curves for the potentials of 0 V and 750 V (represented by thick curves) also represent the depletion layer edges.

In the semiconductor device according to the first embodiment that includes spiral thin film 10, the local potential at a specific location on substrate 1 is almost equalized by the local potential at a specific location, above the specific location on substrate 1, of spiral thin film 10, and a stable breakdown voltage is obtained. Moreover, since spiral thin film 10 exhibits shield effects against disturbances such as ions 15 (or electric charges) in the plastic mold of the semiconductor device, deviations of the breakdown voltage are hardly caused, even when high voltage is applied at a high temperature. Thus, a very reliable semiconductor device is obtained.

Figure 3:
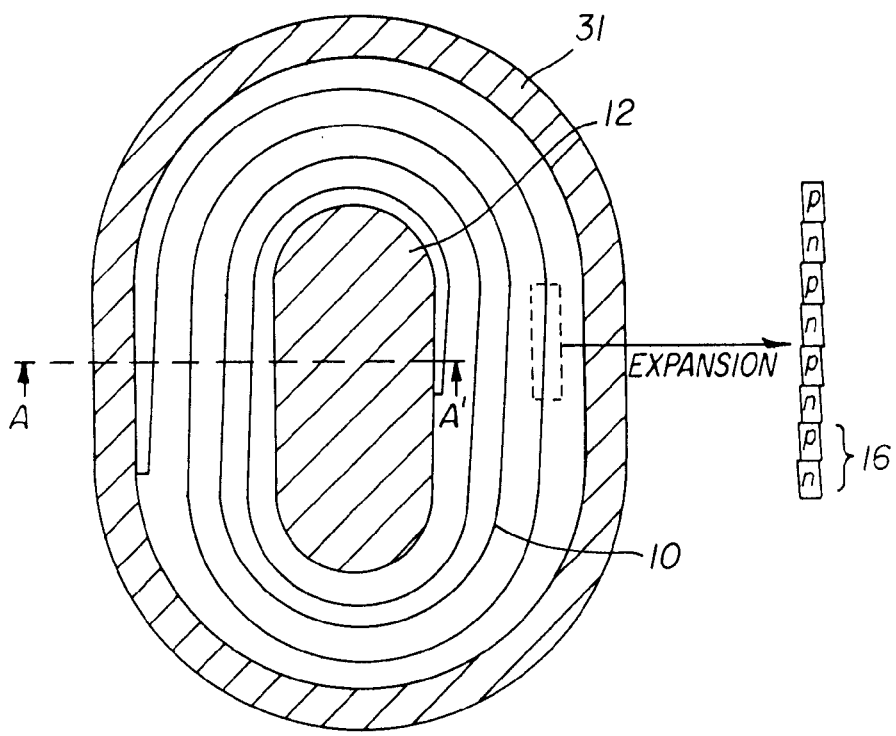
FIG. 3 is a top plan view of a semiconductor device according to a second embodiment of the invention.
Figure 4:
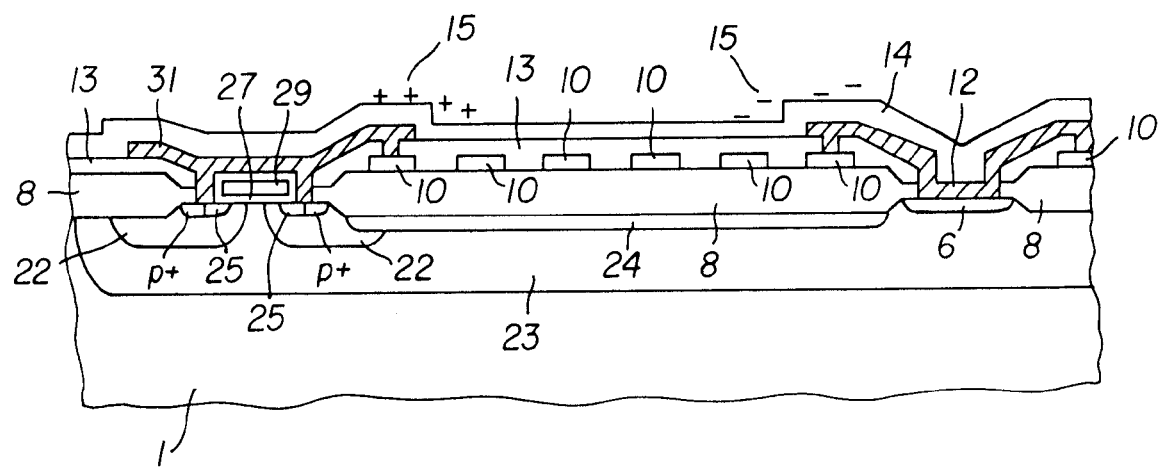
FIG. 4 is a cross section along A–A' of FIG. 3.

FIG. 3 is a top plan view of a semiconductor device according to a second embodiment of the invention. FIG. 4 is a cross section along A–A' of FIG. 3. Referring to FIGS. 3 and 4, the semiconductor device according to the second embodiment includes a highly resistive p-type substrate 1, the resistivity thereof is around 125 ohms/sqaure; an n-type offset region 23 in the surface portion of substrate 1; a p-type base region 22 in the surface portion of n-type offset region 23; base region 22 including an $n^+$-type source region 25 in the surface portion thereof, and base region 22 including a channel portion in the extended portion thereof, extending between source region 25 and n-type offset region 23; an $n^+$-type drain region 6 in the surface portion of n-type offset region 23, drain region 6 being spaced apart for about 80 micrometers form source region 25; a p-type offset region 24 on n-type offset region 23 between source region 25 and drain region 6, the potential of p-type offset region 24 being fixed at the source potential; a field oxide film 8 on p-type offset region 24; a gate oxide film 27 on the channel portion of base region 22; a gate electrode 29 on gate oxide film 27; a source electrode 31 on source region 25; a drain electrode 12 on drain region 6; an interlayer film 13; and a protection film 14. Ions 15 (or electric charges) shown in FIG. 4 are in the plastic mold of the semiconductor device. A p$^+$-type region is disposed on base region 22 to secure ohmic contact for base region 22.

A spiral polysilicon thin film 10 is arranged on field oxide film 8. An end of thin film 10 is connected to drain electrode 12 and another end thereof to source electrode 31. As shown in the enlarged drawing of FIG. 3, thin film 10 includes about 200 pn-diodes 16 connected in series. Since the breakdown voltage of one pn-diode 16 is about 5 V, the breakdown voltage of thin film 10 is 5V×200=1000 V in total.

As shown in FIG. 4, six cross sections of spiral thin film 10 appear at a certain interval on field oxide film 8 in some cross sections. When a reverse bias voltage (750 V in this case) is applied between the source and the drain, the source is biased at 0 V and the drain at 750 V. A voltage difference of about 150 V is caused across one turn of spiral thin film 10 due to the voltage drop caused by the saturation current of the pn-diodes in spiral thin film 10 arranged between the source and the drain.

Figure 14:
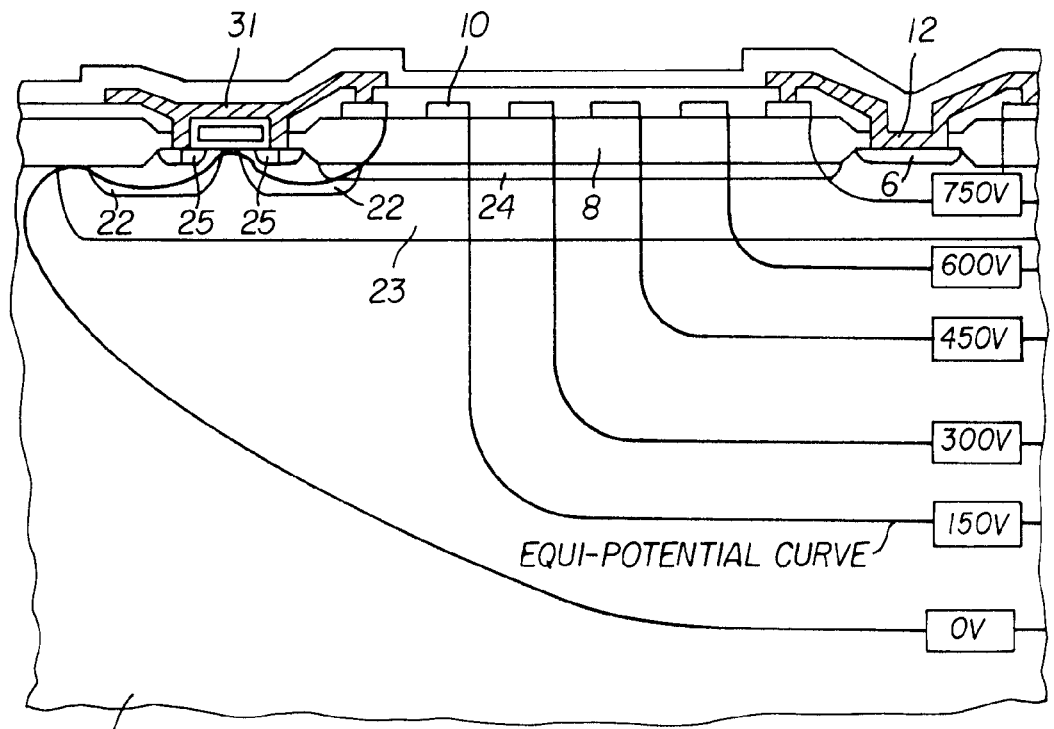
FIG. 14 is a cross sectional view showing equipotential curves across the semiconductor device according to the second embodiment for the reverse bias voltage of 750 V applied between the source and the drain.

FIG. 14 is a cross sectional view showing equipotential curves across the semiconductor device according to the second embodiment for the reverse bias voltage of 750 V applied between the source and the drain. In the figure, the equipotential curves for the potentials of 0 V and 750 V (represented by thick curves) also represent the depletion layer edges.

In the semiconductor device according to the second embodiment that includes spiral thin film 10, the local potential at a specific location on substrate 1 is almost equalized by the local potential at a specific location of spiral thin film 10, which is above the specific location on substrate 1. A stable breakdown voltage is obtained in the same way as in the semiconductor device according to the first embodiment. Moreover, since spiral thin film 10 exhibits shield effects against disturbances such as ions 15 (or electric charges) in the plastic mold of the semiconductor device, deviations of the breakdown voltage are hardly caused, even when high voltage is applied at a high temperature. Thus, a very reliable semiconductor device is obtained.

Figure 5:
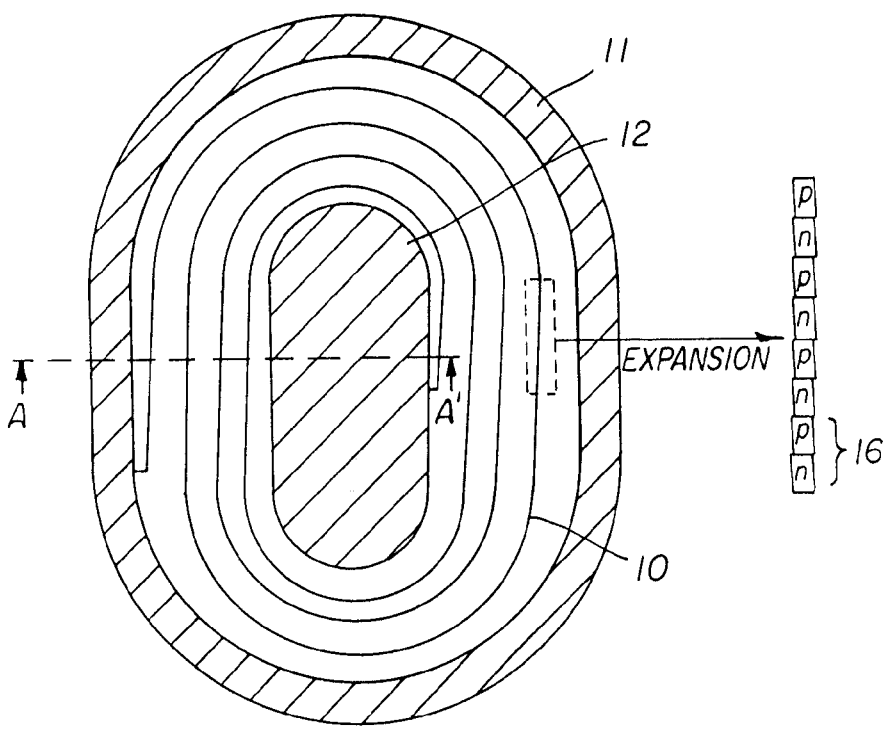
FIG. 5 is a top plan view of a semiconductor device according to a third embodiment of the invention.
Figure 6:
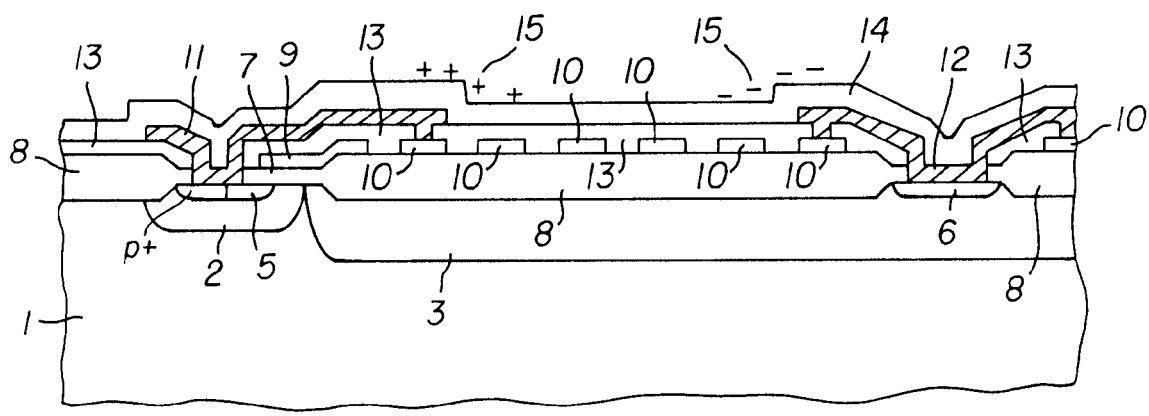
FIG. 6 is a cross section along A–A' of FIG. 5.
Figure 15:
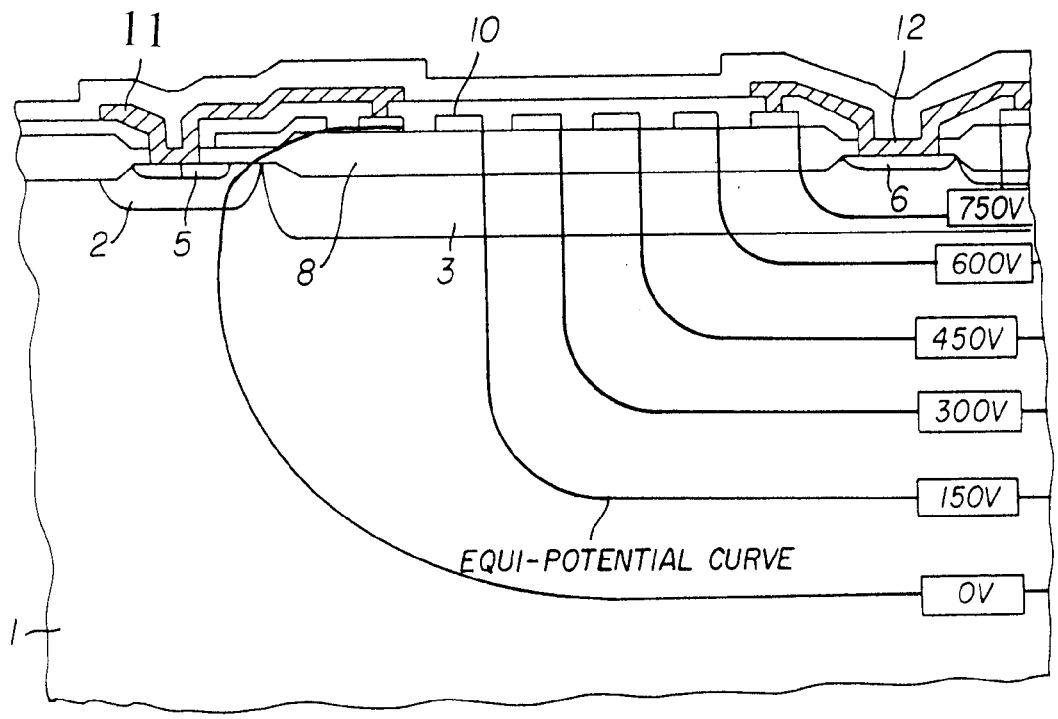
FIG. 15 is a cross sectional view showing equipotential curves across the semiconductor device according to the third embodiment for the reverse bias voltage of 750 V applied between the source and the drain.
Figure 23:
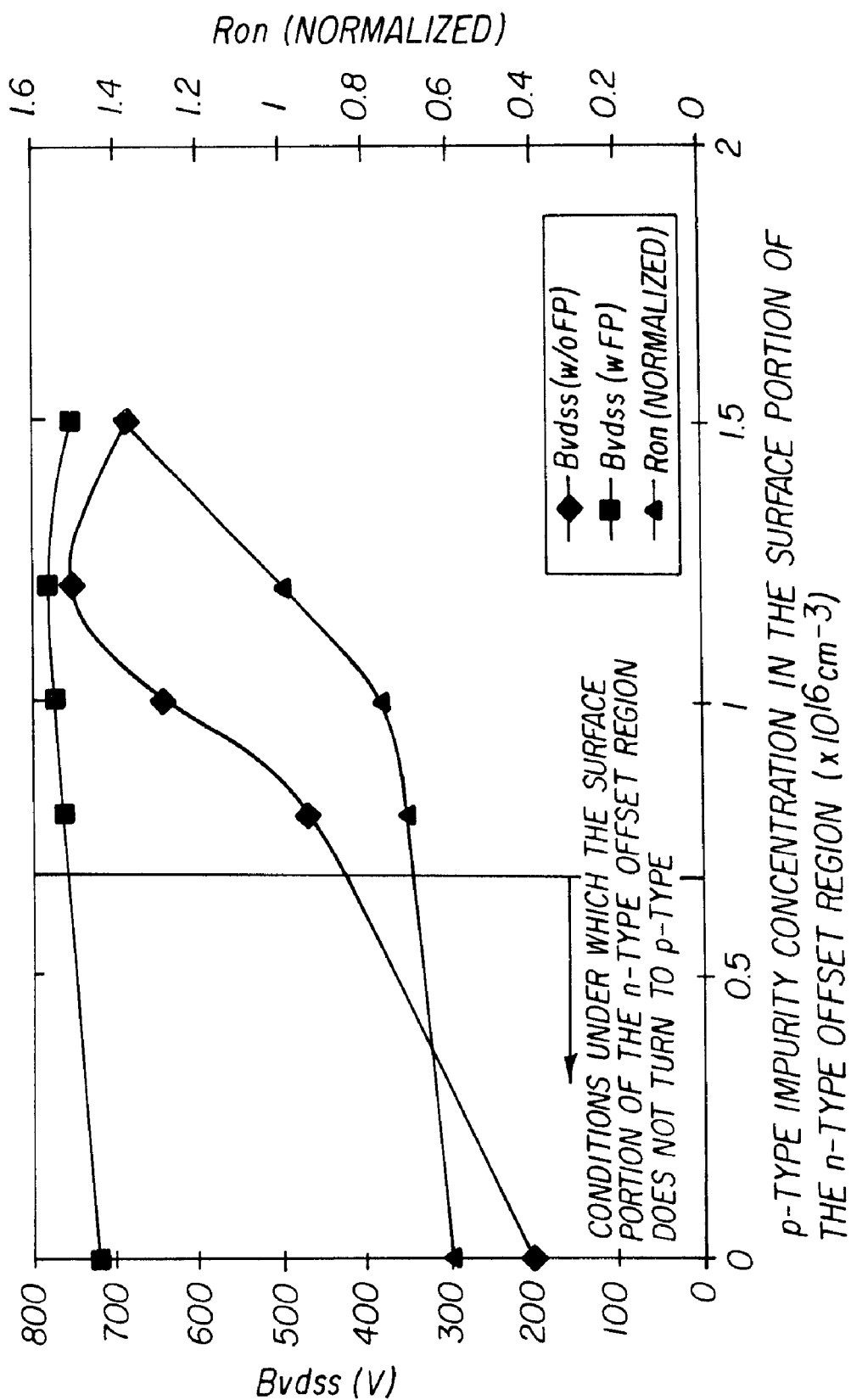
FIG. 23 shows a set of curves relating the breakdown voltage and the on-resistance with the p-type impurity concentration in the surface portion of the n-type offset region, the n-type impurity concentration therein is $7 \times 10^{15} \text{cm}^{-3}$.

FIG. 5 is a top plan view of a semiconductor device according to a third embodiment of the invention. FIG. 6 is a cross section along A–A' of FIG. 5. Referring to FIGS. 5 and 6, the semiconductor device according to the third embodiment omits p-type offset region 4 from the semiconductor device according to the first embodiment. Since a certain breakdown voltage is secured without provision of p-type offset region 4 when n-type offset region 3 is lightly doped and shallow, as FIG. 23 indicates, the potential distribution as shown in FIG. 15 is obtained. The semiconductor device according to the third embodiment facilitates obtaining a stable and reliable breakdown voltage and reducing the on-resistance. Under the conditions for no p-type offset region in FIG. 23, the on-resistance may be reduced by 40% as compared with the provision of the p-type offset region under the conventional conditions (the conditions for the normalized on-resistance value Ron of unity).

Figure 7:
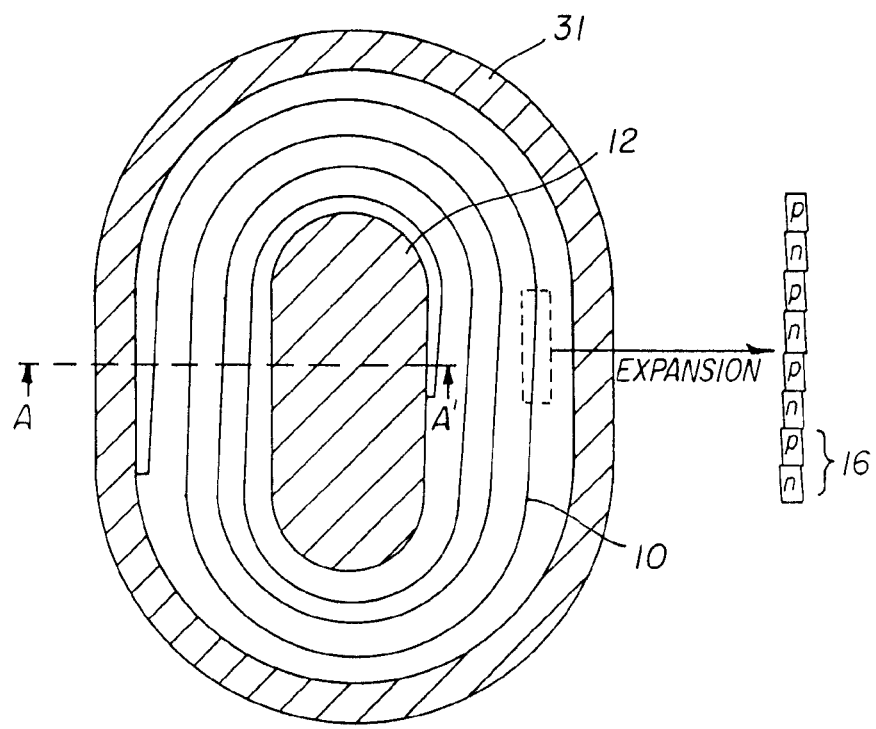
FIG. 7 is a top plan view of a semiconductor device according to a fourth embodiment of the invention.
Figure 8:
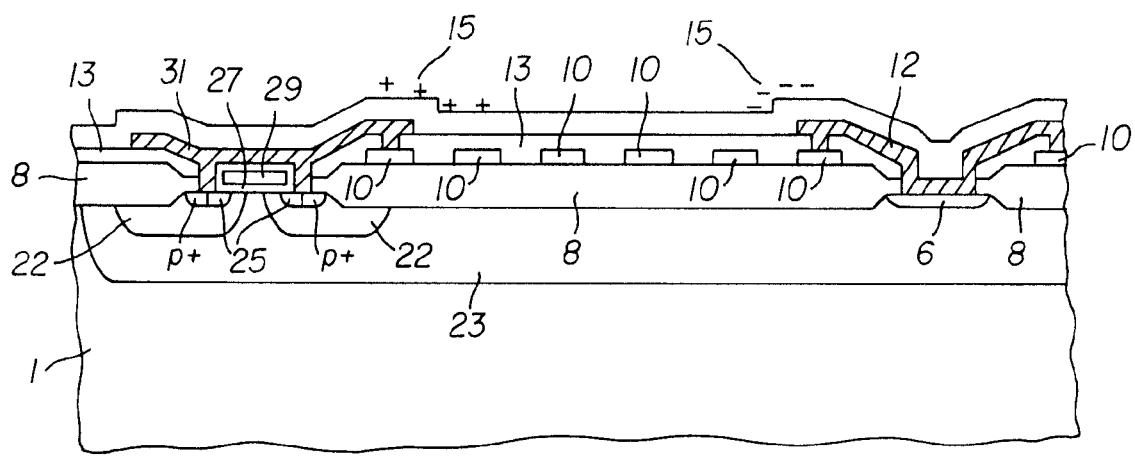
FIG. 8 is a cross section along A–A' of FIG. 7.
Figure 16:
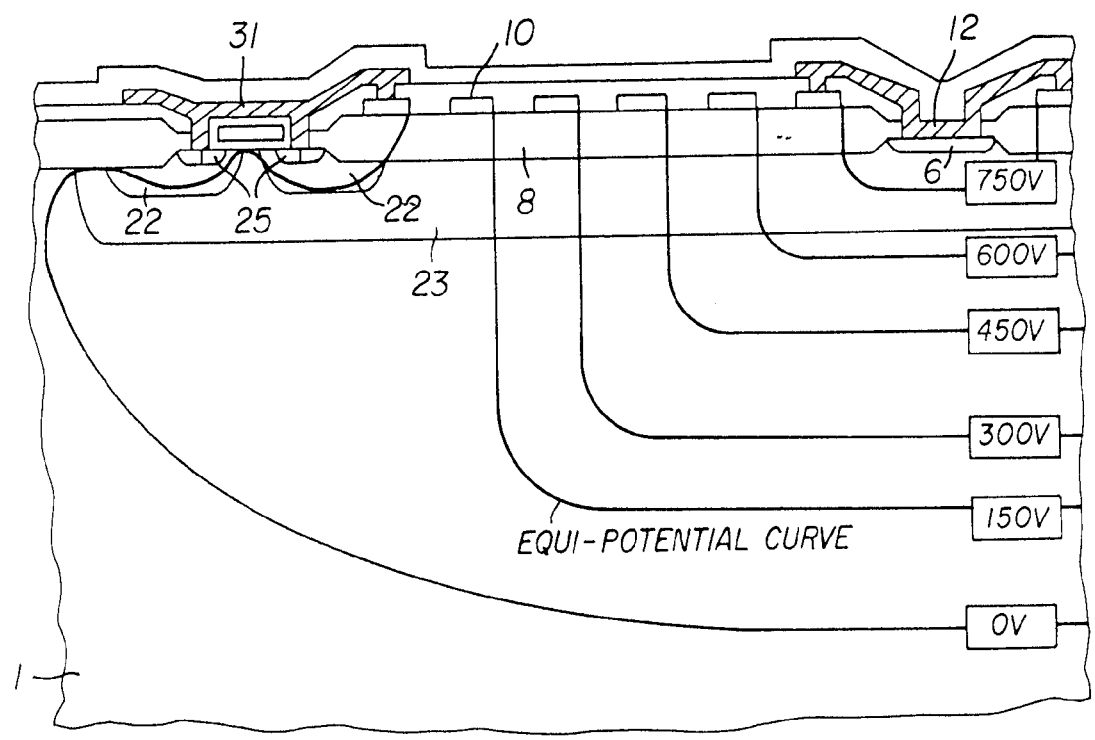
FIG. 16 is a cross sectional view showing equipotential curves across the semiconductor device according to the fourth embodiment for the reverse bias voltage of 750 V applied between the source and the drain.

FIG. 7 is a top plan view of a semiconductor device according to a fourth embodiment of the invention. FIG. 8 is a cross section along A–A' of FIG. 7. Referring to FIGS. 7 and 8, the semiconductor device according to the fourth embodiment omits p-type offset region 24 from the semiconductor device according to the second embodiment. A certain breakdown voltage is secured without provision of p-type offset region 24 when n-type offset region 23 is lightly doped and shallow, as FIG. 23 indicates, and the potential distribution as shown in FIG. 16 is obtained. The semiconductor device according to the fourth embodiment facilitates obtaining a stable and reliable breakdown voltage and reducing the on-resistance. Under the conditions for no p-type offset region in FIG. 23, the on-resistance may be reduced by 40% as compared with the provision of the p-type offset region under the conventional conditions (the conditions for the normalized on-resistance value Ron of unity).

Figure 9:
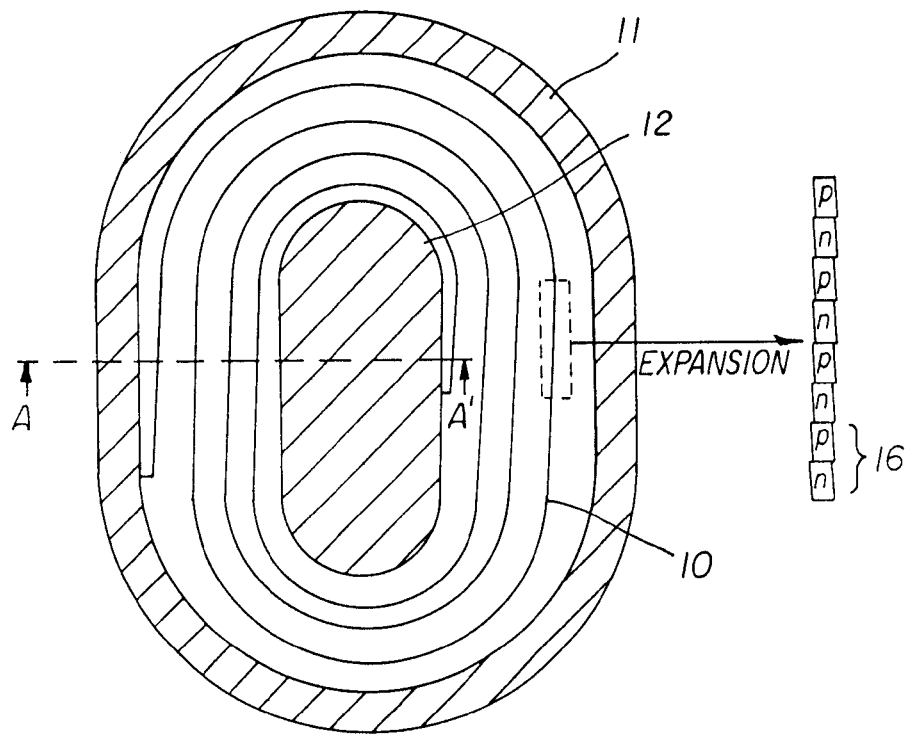
FIG. 9 is a top plan view of a semiconductor device according to a fifth embodiment of the invention.
Figure 10:
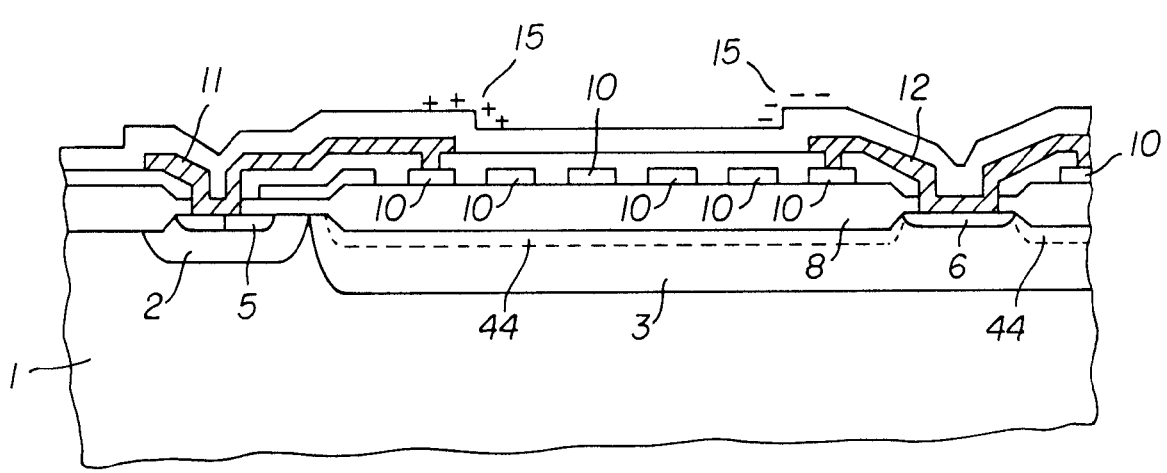
FIG. 10 is a cross section along A–A' of FIG. 9.
Figure 17:
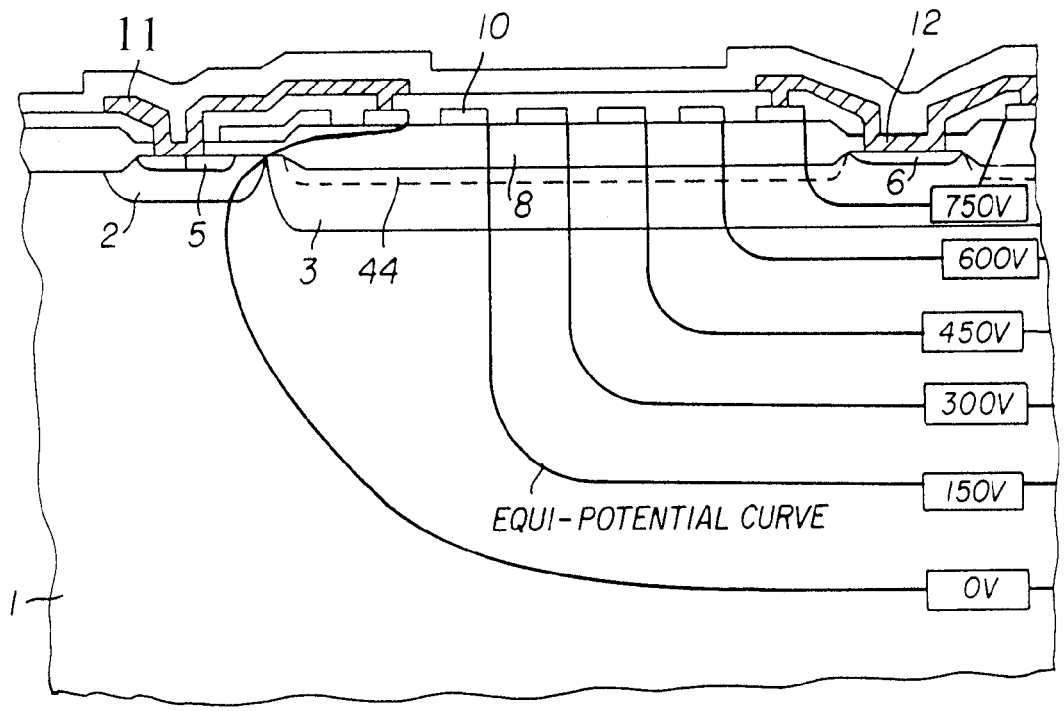
FIG. 17 is a cross sectional view showing equipotential curves across the semiconductor device according to the fifth embodiment for the reverse bias voltage of 750 V applied between the source and the drain.
Figure 22:
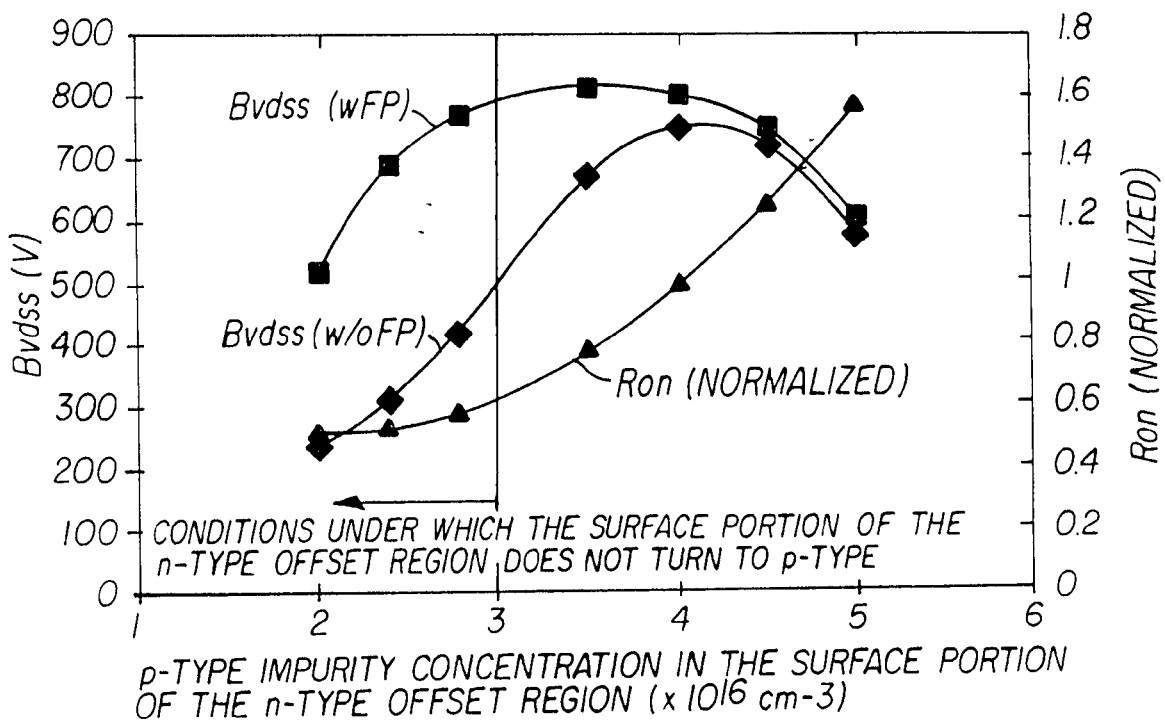
FIG. 22 shows a set of curves relating the breakdown voltage and the on-resistance with the p-type impurity concentration in the surface portion of the n-type offset region, the n-type impurity concentration therein is $3 \times 10^{16} cm^{-3}$.

FIG. 9 is a top plan view of a semiconductor device according to a fifth embodiment of the invention. FIG. 10 is a cross section along A–A' of FIG. 9. The semiconductor device according to the fifth embodiment includes a counter-doped region 44 formed by counter-doping p-type impurities to the surface portion of n-type offset region 3 in FIG. 6, but to such an extent that the counter-doped surface portion is turned into p-type. A certain breakdown voltage is secured by the provision of counter-doped region 44, even when n-type offset region 3 is heavily doped and deep as FIG. 22 indicates, and the potential distribution shown in FIG. 17 is obtained. The semiconductor device according to the fifth embodiment facilitates obtaining a stable and reliable breakdown voltage and reducing the on-resistance. That is, when the p-type impurity concentration in the surface portion of the n-type offset region, i.e. the p-type impurity concentration in counter-doped region 44, is $3 \times 10^{16}$ cm$^{-3}$, the on-resistance is reduced by 35% as compared with when the p-type impurity concentration in p-type offset region 4 is $4 \times 10^{16}$ cm$^{-3}$, corresponding to the normalized on-resistance value Ron of unity.

Figure 11:
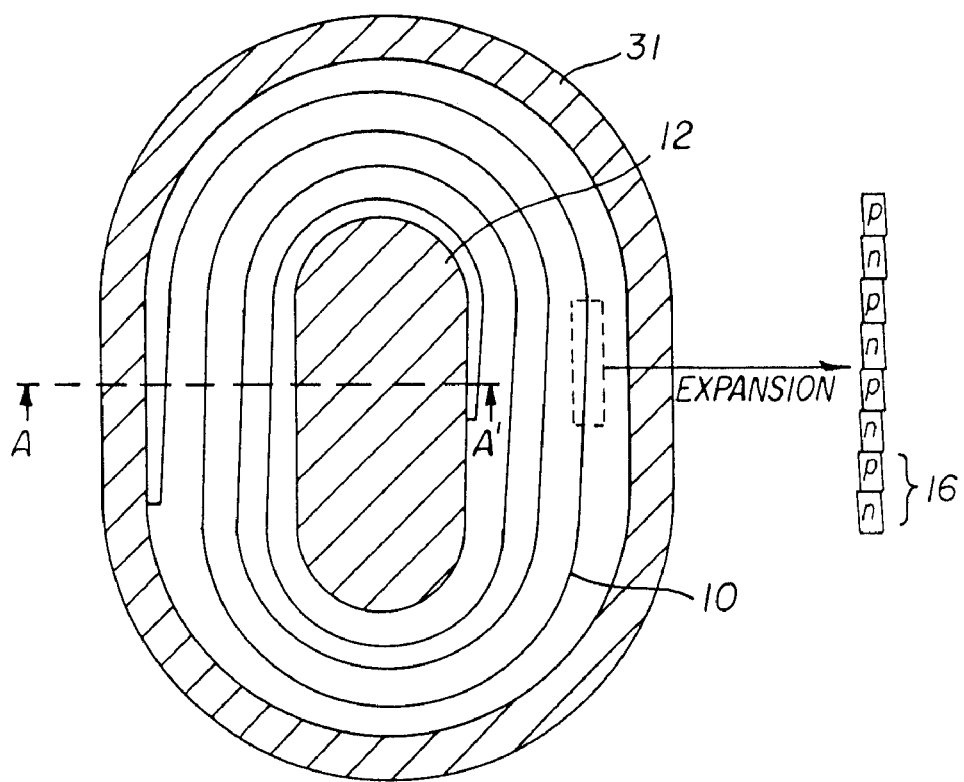
FIG. 11 is a top plan view of a semiconductor device according to a sixth embodiment of the invention.
Figure 12:
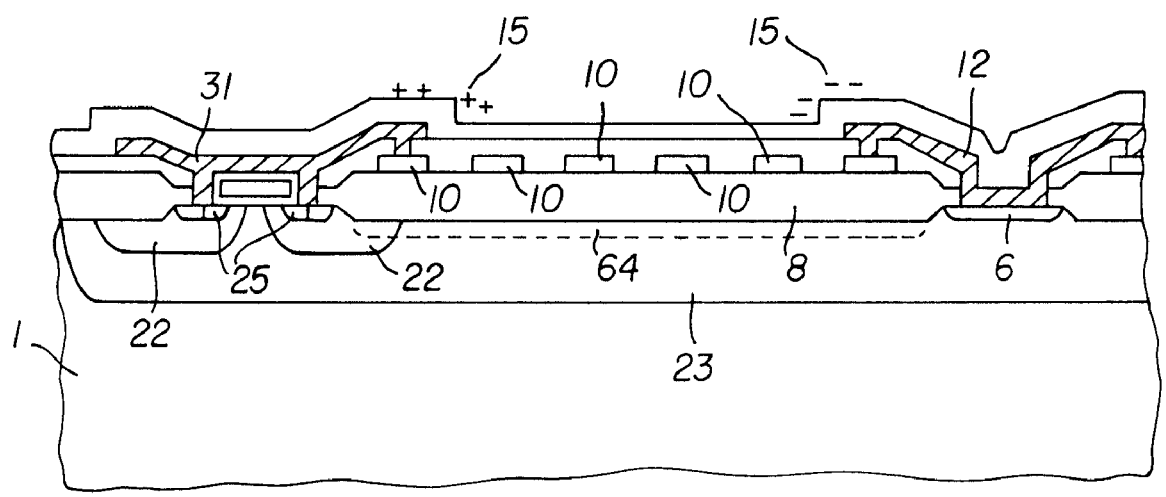
FIG. 12 is a cross section along A–A' of FIG. 11.
Figure 18:
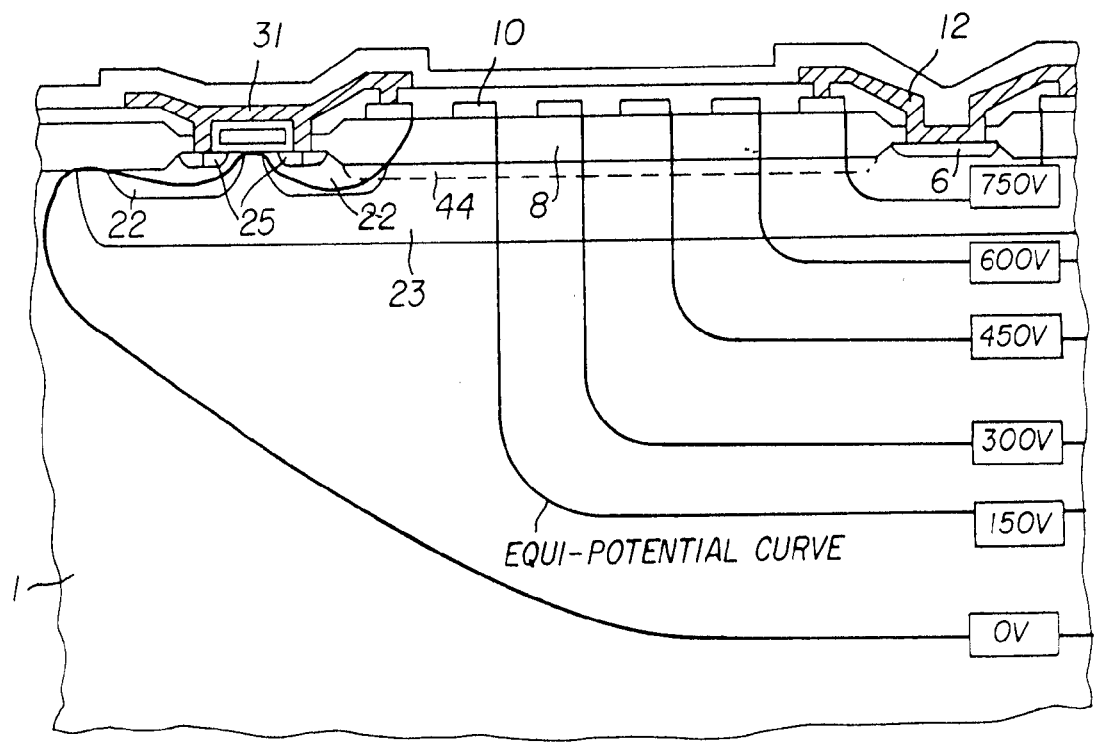
FIG. 18 is a cross sectional view showing equipotential curves across the semiconductor device according to the sixth embodiment for the reverse bias voltage of 750 V applied between the source and the drain.
Figure 19:
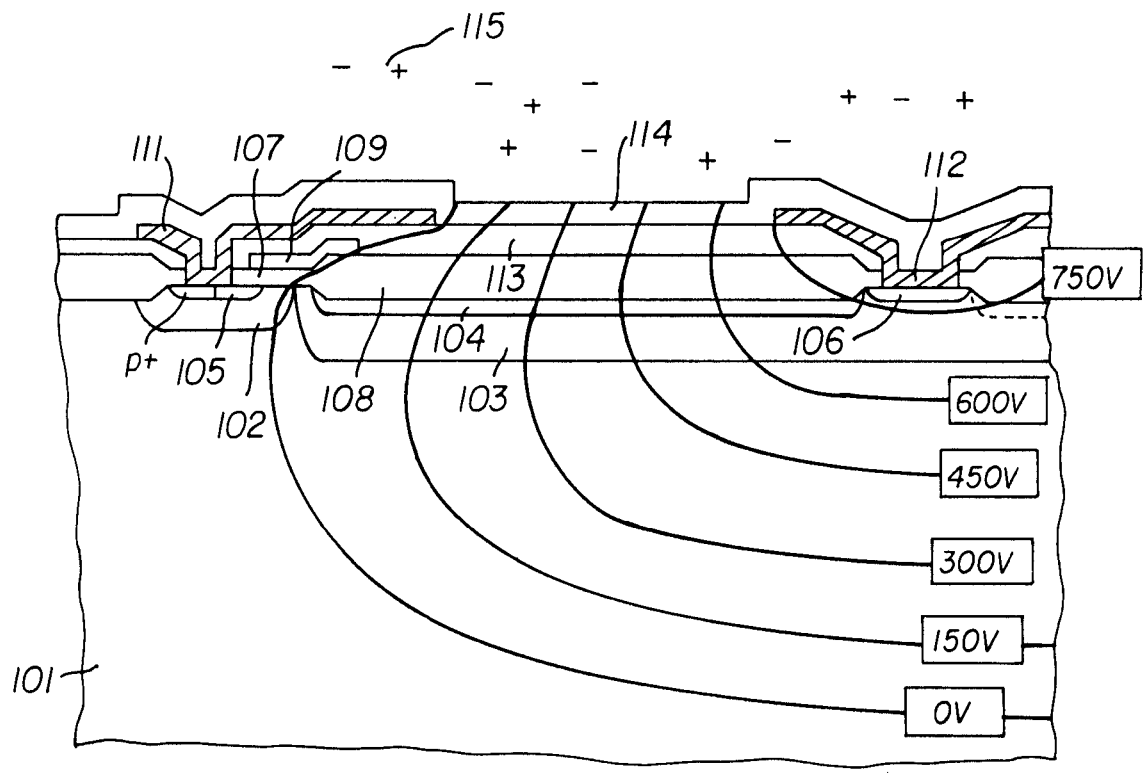
FIG. 19 is a cross sectional view showing a first conventional lateral power MOSFET in the initial state thereof and equipotential curves therein.
Figure 20:
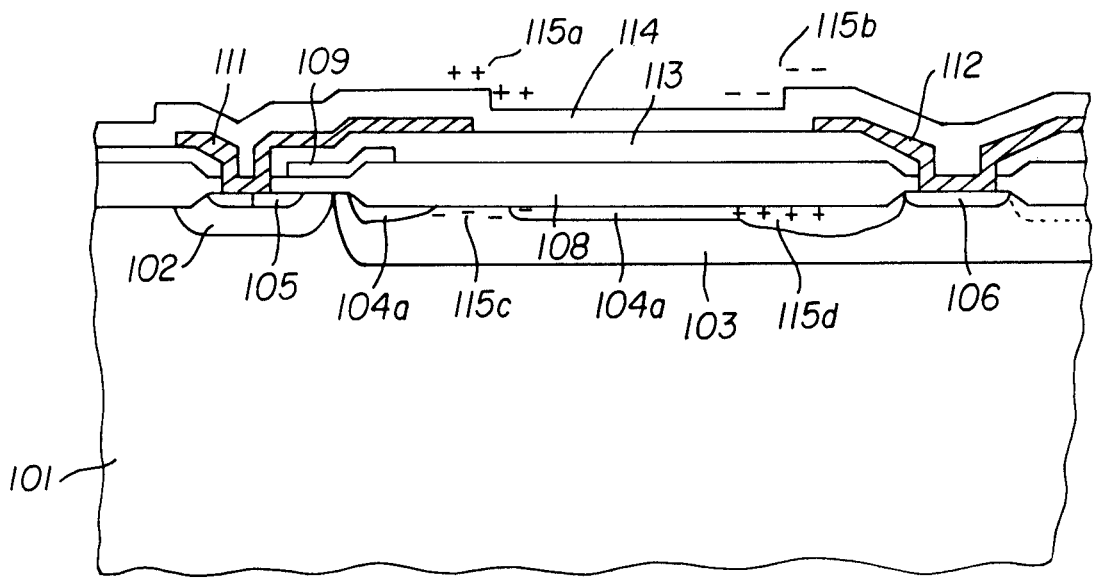
FIG. 20 is a cross sectional view showing the first conventional lateral power MOSFET in the state wherein the breakdown voltage thereof is changed.
Figure 21:
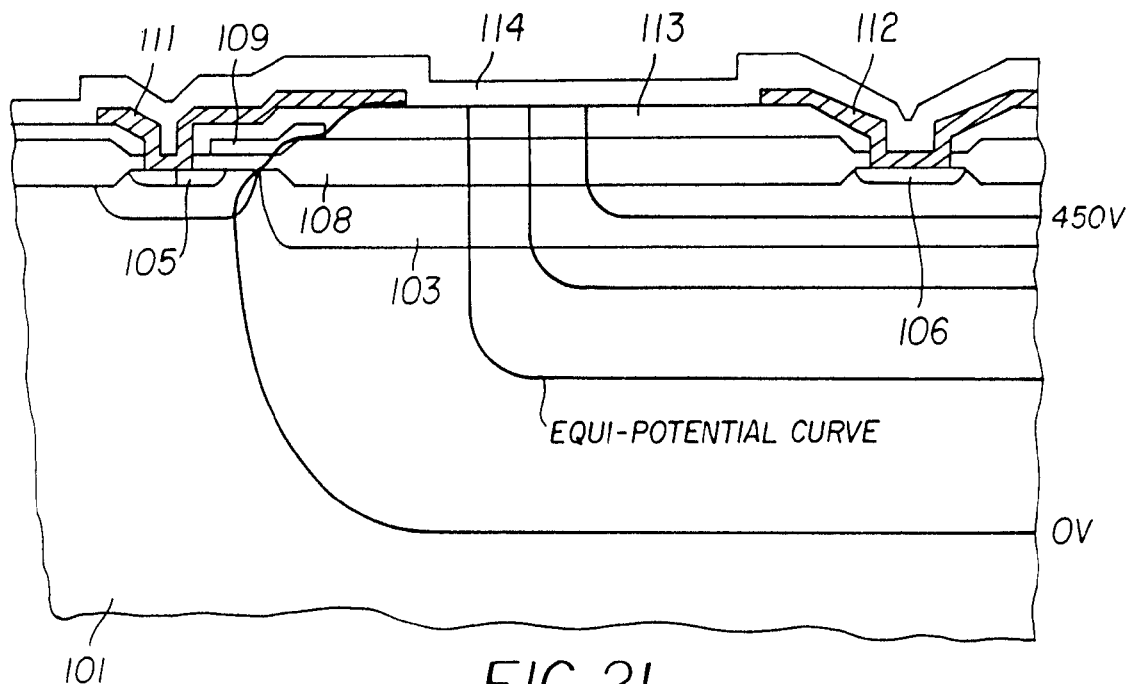
FIG. 21 is a cross sectional view showing a second conventional lateral power MOSFET and equipotential curves therein.

FIG. 11 is a top plan view of a semiconductor device according to a sixth embodiment of the invention. FIG. 12 is a cross section along A–A' of FIG. 11. The semiconductor device according to the sixth embodiment includes a counter-doped region 64 formed by counter-doping p-type impurities to the surface portion of n-type offset region 23 in FIG. 8, but not to such an extent that the counter-doped surface portion is turned into p-type. A certain breakdown voltage is secured by the provision of counter-doped region 64, even when n-type offset region 23 is heavily doped and deep as FIG. 22 indicates, and the potential distribution shown in FIG. 18 is obtained. The semiconductor device according to the sixth embodiment facilitates obtaining a stable and reliable breakdown voltage and reducing the on-resistance. That is, when the p-type impurity concentration in the surface portion of the n-type offset region, i.e. the p-type impurity concentration in counter-doped region 64, is $3 \times 10^{16}$ cm$^{-3}$, the on-resistance is reduced by 35%, as compared with the situation when the p-type impurity concentration in p-type offset region 24 is $4 \times 10^{16}$ cm$^{-3}$, corresponding to the normalized on-resistance value Ron of unity.

Figure 24:
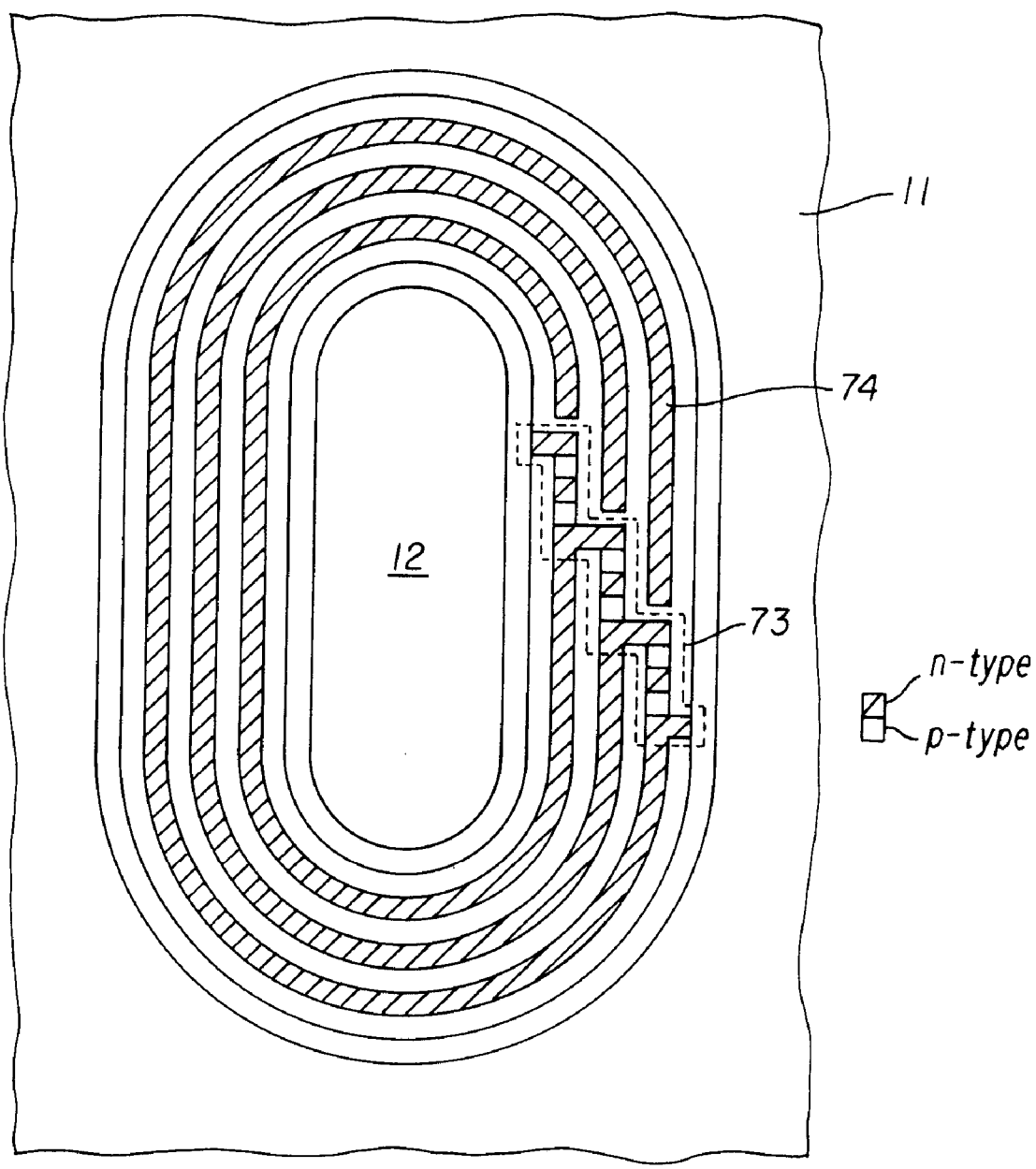
FIG. 24 is a top plan view of a spiral thin film in a semiconductor device according to a seventh embodiment of the invention.

FIG. 24 is a top plan view of a spiral thin film in a semiconductor device according to a seventh embodiment of the invention. Referring to FIG. 24, a spiral thin film 70 includes a thin film 73 formed of pn-diodes connected in series and a resistor 74. Hereinafter, the thin film formed of multiple pn-diodes will be referred to as the "thin film of pn-diodes". An end of thin film of pn-diode 73 is connected to a source electrode 11 and another end thereof to a drain electrode 12. Thin film of pn-diodes 73 may be shaped with a helix that surrounds drain electrode 12. Resistor 74 branches from a midpoint of thin film of pn-diode 73. Resistor 74 is parallel to source electrode 11 and drain electrode 12. Resistor 74 is formed of the n-type layer of thin film of pn-diodes 73. The semiconductor device according to the seventh embodiment exhibits the same effects as the semiconductor devices according to the first through the sixth embodiments.

Figure 25:
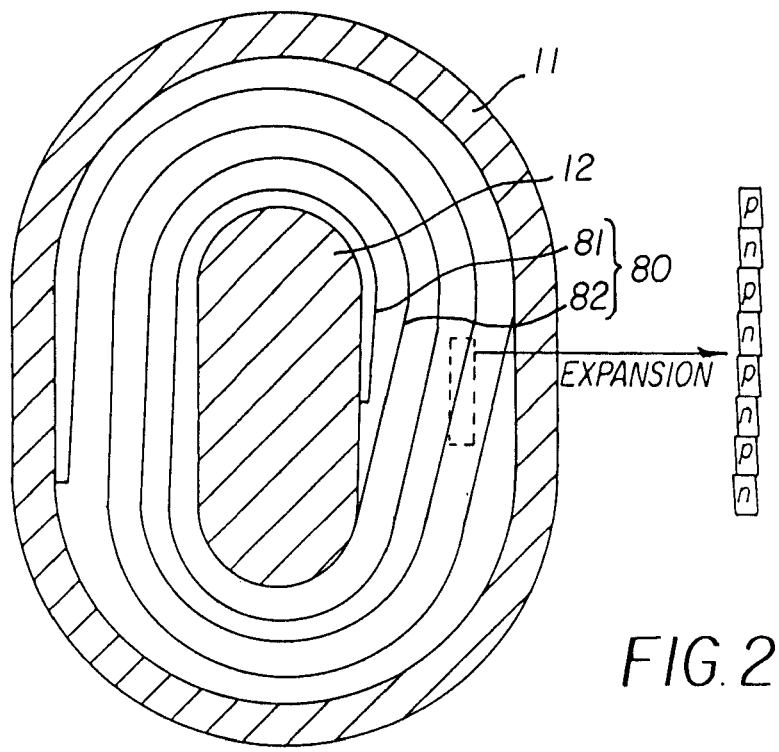
FIG. 25 is a top plan view of a spiral thin film in a semiconductor device according to an eighth embodiment of the invention.

FIG. 25 is a top plan view of a spiral thin film in a semiconductor device according to an eighth embodiment of the invention. Referring to FIG. 25, a spiral thin film 80 includes multiple trains of pn-diodes. In FIG. 25, two trains of pn-diodes 81 and 82 are shown. The semiconductor device according to the eighth embodiment exhibits the same effects as the semiconductor devices according to the first through the sixth embodiments.

Figure 26:
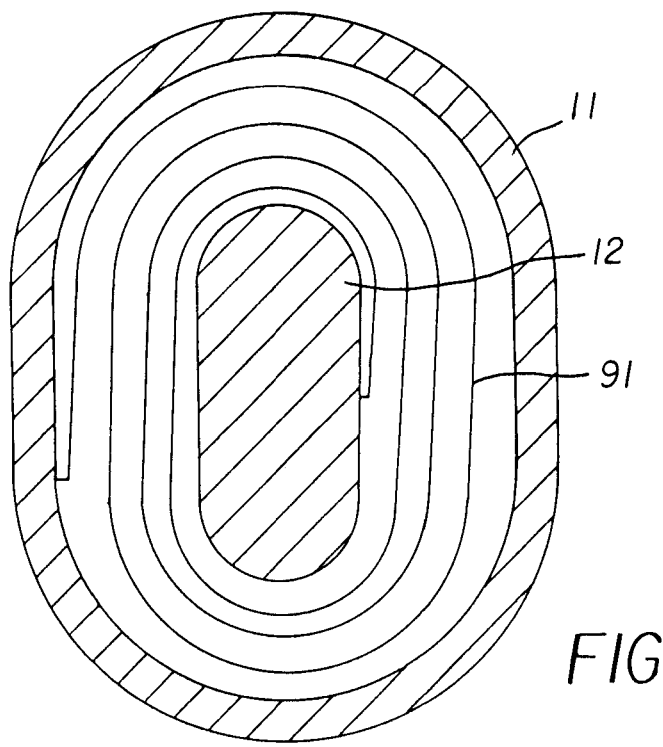
FIG. 26 is a top plan view of a spiral thin film in a semiconductor device according to a ninth embodiment of the invention.

FIG. 26 is a top plan view of a spiral thin film in a semiconductor device according to a ninth embodiment of the invention. Referring to FIG. 26, a spiral thin film 91 is formed of a highly resistive layer replacing the foregoing spiral thin film of pn-diodes. The semiconductor device according to the ninth embodiment exhibits the same effects as the semiconductor devices according to the first through the sixth embodiments do.

It is a concern that the switching characteristics of the structure described above, wherein a helical thin film of pn-diodes or a helical resistive layer is formed between the source and the drain, may be impaired by the parasitic capacitance and the parasitic resistance. Moreover, since the p-type layer or the n-type layer of the pn-diodes and the thin resistive layer are at almost the same potential, too wide p-type layer or n-type layer of the pn-diodes and too wide thin resistive layer may cause lowering of the initial breakdown voltage.

To improve the switching characteristics, it is preferred to reduce the parasitic capacitance and the parasitic resistance. To improve the breakdown voltage in the peripheral portion of the high-breakdown-voltage MOSFET, wherein the distance between the source electrode and the drain electrode in the peripheral portion of the device is long, it is advisable to widen the thin resistive layer without lowering the breakdown voltage in the peripheral portion to suppress the influence of the ions in the plastic mold.

Figure 27B:
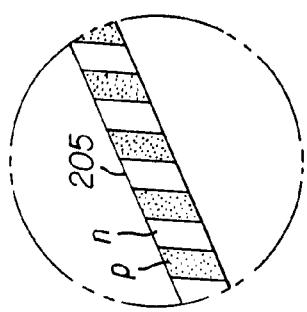
FIG. 27(b) is an expanded view of the portion A of FIG. 27(a).
Figure 27C:
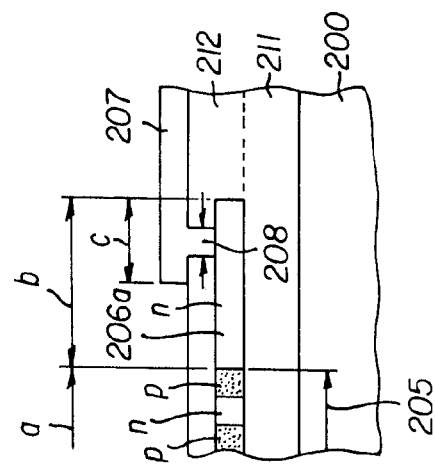
FIG. 27(c) is cross sectional view along X—X of FIG. 27(a).

FIG. 27($a$) is a top plan view of a semiconductor device according to a tenth embodiment of the invention. FIG. 27($b$) is an expanded view of the portion A of FIG. 27($a$). FIG. 27($c$) is a cross sectional view along X—X of FIG. 27($a$). As an example, the semiconductor device according to the tenth embodiment is a lateral MOSFET exhibiting a high breakdown voltage of the 700 V class. A plurality of thin films 205, extending obliquely in FIG. 27($a$), formed of multiple pn-diodes and connected to respective semicircular aluminum resistive layers 207, is formed between a source electrode 202 and a drain electrode 204. The pn-diodes 205 are preferably polysilicon Zener diodes. Aluminum resistive layer 207 is an aluminum layer containing a small amount of silicon and is sometimes called an "aluminum-silicon layer". The resistance of the aluminum-silicon layer is higher than that of aluminum metal. Thin film of pn-diodes 205 is connected to aluminum resistive layer 207 via n-type polysilicon resistive layers 206$a$ and 206$b$ formed on both ends of thin film of pn-diodes 205. The polysilicon resistive layers 206$a$ and 206$b$ may be of p-type.

In more detail, source electrode 202 and n-type polysilicon resistive layer 206$b$ are connected with each other at a location B as shown in FIG. 27($a$). The n-type polysilicon resistive layer 206$a$ and aluminum resistive layer 207 are connected with each other through a connection hole 208 as shown in FIG. 27($c$). Drain electrode 204 and n-type polysilicon resistive layer 206$b$ are connected with each other at a location C as shown in FIG. 27($a$). The straight section b of the n-type polysilicon resistive layer and the straight section c of the aluminum resistive layer are connected with each other through connection hole 208 as shown in FIG. 27($c$).

Source electrode 202 and drain electrode 204 are connected with each other via a plurality of half turns of a train formed of thin film of pn-diodes 205, n-type polysilicon resistive layers 206$a$ and 206$b$, and aluminum resistive layer 207. The thin films of pn-diodes 205 and n-type polysilicon resistive layers 206$a$ and 206$b$ are made of the same polysilicon. The polysilicon Zener diode is formed by doping p-type impurities and n-type impurities to alternately arranged portions of the same polysilicon. For example, n-type polysilicon resistive layers 206$a$ and 206$b$ are formed on both ends of thin film of pn-diodes 205 by doping n-type impurities to the straight sections b (the sections parallel to source electrode 202 or drain electrode 204) of thin films of pn-diodes 205.

An inner circumferential edge 209 of source electrode 202 and an outer circumferential edge 210 of drain electrode 204 are arranged closely to a source region 201 and a drain region 203, respectively. The extended portions of source electrode 202 and drain electrode 204 extending from source region 201 and drain region 203 are insulated from a semiconductor substrate 200 by a second interlayer insulation film 212 and a first interlayer insulation film 211, that is, a field insulation film.

Thin films of pn-diodes 205, n-type polysilicon resistive layers 206$a$ and 206$b$ and aluminum resistive layer 207 constitute a thin film field plate. The thin film field plate is connected to source electrode 202 and drain electrode 204. When a voltage is applied between source electrode 202 and drain electrode 204, a reverse bias voltage is applied across each diode (each pn-junction) of thin film of pn-diodes 205 and each pn-junction (junction capacitance) bears the potential. The breakdown voltage of each pn-diode is around 5 V. When the desired breakdown voltage is 700 V, the voltage applied across each diode is 2.5 V by forming thin film 205 of 280 pn-diodes. The thin film field plate facilitates obtaining a stable breakdown voltage.

Referring to FIG. 27($c$), the thin film field plate, including thin film of pn-diodes 205 (n-type polysilicon resistive layer 206$a$) and aluminum resistive layer 207, is formed such that the spacing between pn-diodes 205 (n-type polysilicon resistive layer 206$a$) and semiconductor substrate 200 is 600 nm, and the spacing between aluminum resistive layer 207 and semiconductor substrate 200 is 1200 nm. The sheet resistance of aluminum resistive layer 207 is 35 m Ω/□

The thin film field plate according to the tenth embodiment reduces the parasitic resistance to about 1/7000 of that of a field plate formed of an n-type polysilicon resistive layer, exhibiting sheet resistance of around 250 Ω/□ and spaced apart from semiconductor substrate 200 by 600 nm. In other words, the thin film field plate according to the tenth embodiment facilitates improving the response characteristics of the device due to the resistance component thereof, preventing the transient potential distribution in the thin film field plate from being non-uniform and preventing the breakdown voltage from lowering during high frequency operation of the device. Aluminum resistive layer 207 is more effective, because the resistance thereof is smaller.

However, it is difficult to employ metal aluminum as aluminum resistive layer 207, since the metal aluminum does not adhere sufficiently to the interlayer insulation film.

The parasitic resistance of the thin film field plate according to the tenth embodiment is reduced to about ½ of that of a thin film field plate formed of an n-type polysilicon resistive layer, exhibiting sheet resistance of around 250 Ω/□ and being spaced apart from semiconductor substrate 200 by about 1200 nm.

The foregoing parasitic resistance R is a resistance component of the thin film field plate. The parasitic capacitance C is caused by stray capacitance between the thin film field plate and semiconductor substrate 200 and the capacitance of the pn-junctions. Therefore, semiconductor substrate 200 is affected by the potential distribution in the thin film field plate at a time constant of t=RC (tau=RC).

Therefore, semiconductor substrate 200 is affected by the uniform potential distribution in the thin film field plate even when the device is operating at a high frequency of 100 kHz or higher; the potential distribution of semiconductor substrate 200 is prevented from distortion; and the breakdown voltage is prevented from lowering.

Figure 27A:
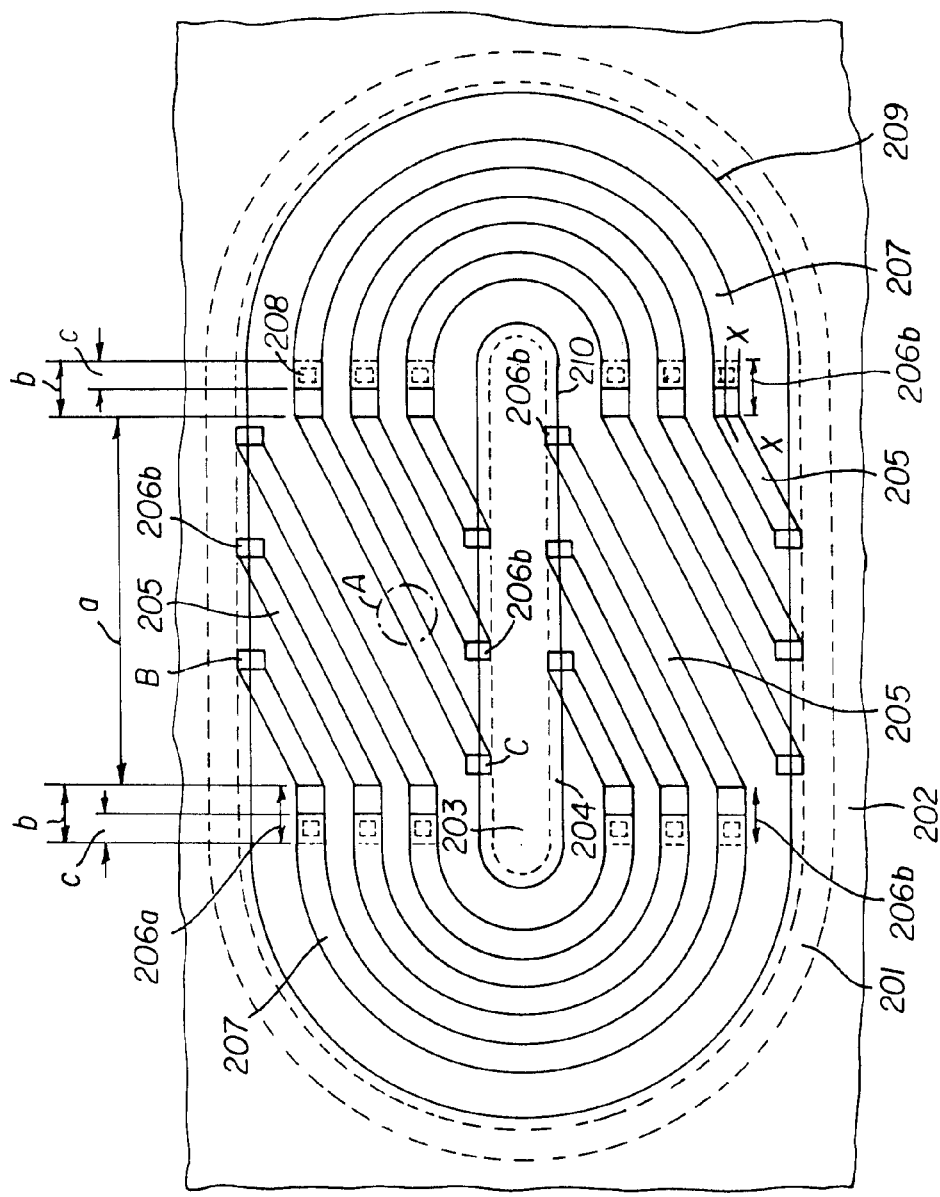
FIG. 27(a) is a top plan view of a semiconductor device according to a tenth embodiment of the invention.
Figure 28:
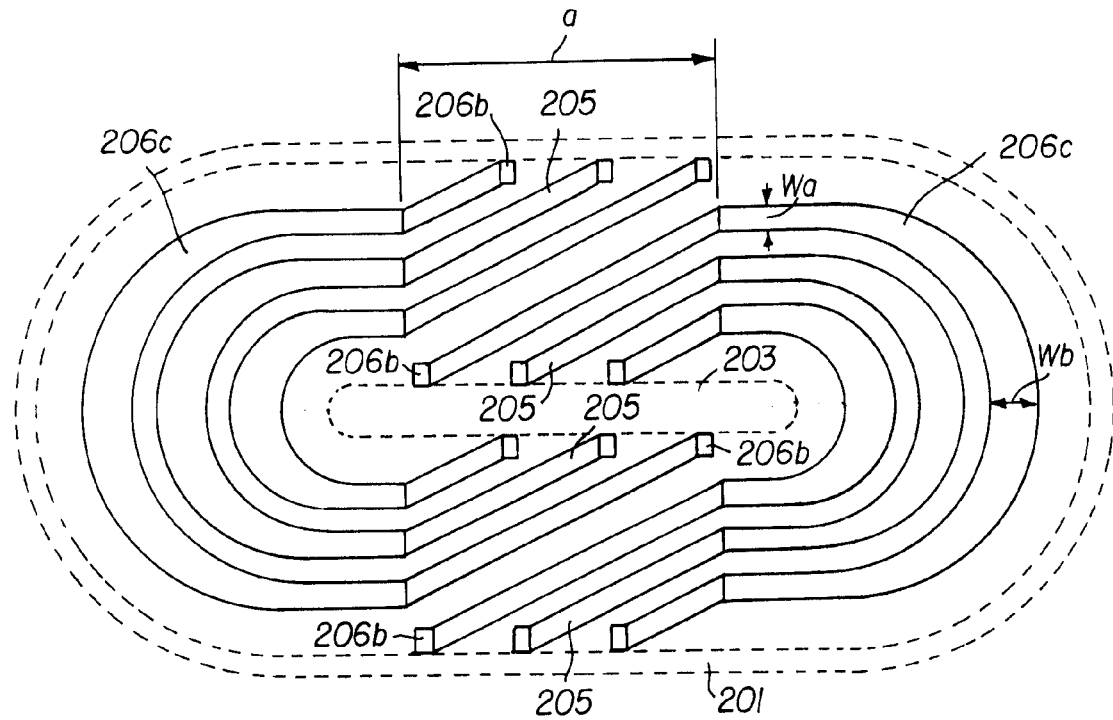
FIG. 28 is a top plan view of a semiconductor device according to an eleventh embodiment of the invention.

FIG. 28 is a top plan view of a semiconductor device according to an eleventh embodiment of the invention. The semiconductor device according to the eleventh embodiment is different from the semiconductor device according to the tenth embodiment in that a semicircular n-type polysilicon resistive layer 206c, which is connected directly to a thin film of pn-diodes 205, is formed in substitution for aluminum resistive layer 207 in the semiconductor device according to the eleventh embodiment. The width Wb of the central portion of n-type polysilicon resistive layer 206c is wider than the width Wa of the both end portions by from 1 to 5 micrometers. The breakdown voltage of the semicircular portion is prevented from lowering by forming n-type polysilicon resistive layer 206c as described above, since the spacing between source electrode 202 and drain electrode 204 in the semicircular portion is set to be wider than that in the straight portion (cf. FIG. 27(a)). The exposed portion of the semiconductor substrate 200 (the portion of semiconductor substrate 200 not covered by n-type polysilicon resistive layer 206c) is minimized, and the undesired influence of ions caused by the mold resin sealing the semiconductor chip is suppressed by widening the semicircular section of n-type polysilicon resistive layer 206c on semiconductor substrate 200.

However, when the width Wb of the central portion of n-type polysilicon resistive layer 206c is widened to around 20 micrometers, the potential beneath n-type polysilicon resistive layer 206c is distorted; the electric field strength becomes higher in the edge portion of n-type polysilicon resistive layer 206c; and the breakdown voltage is lowered.

The n-type polysilicon resistive layer 206c is made of the same polysilicon used for the thin film of pn-diodes 205. The n-type polysilicon resistive layer 206c is formed simultaneously with the formation of n-type polysilicon resistive layer 206b. Therefore the spacing between semiconductor substrate 200 and n-type polysilicon resistive layer 206c is the same as the spacing between the semiconductor substrate 200 and the thin film of pn-diodes 205, and the same as the spacing between semiconductor substrate 200 and n-type polysilicon resistive layer 206c. Source electrode 202 and drain electrode 204 of FIG. 27(a) is not illustrated in FIG. 28.

Figure 29:
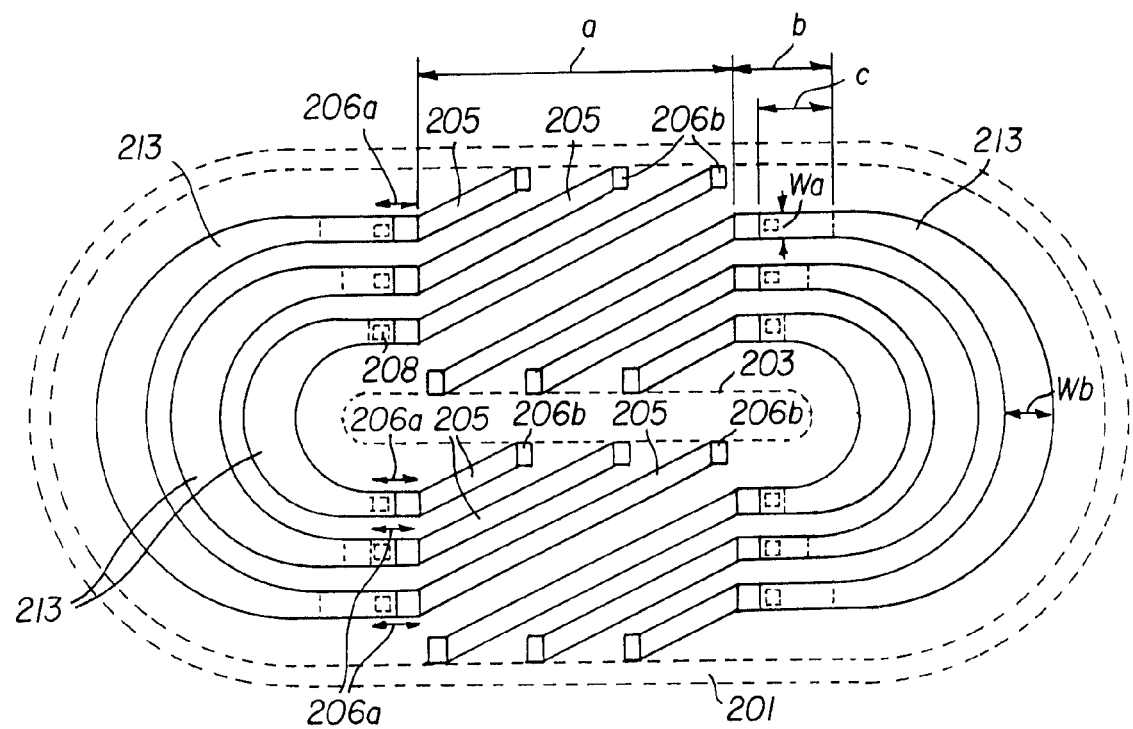
FIG. 29 is a top plan view of a semiconductor device according to a twelfth embodiment of the invention.

FIG. 29 is a top plan view of a semiconductor device according to a twelfth embodiment of the invention. The semiconductor device according to the twelfth embodiment is different from the semiconductor device according to the tenth embodiment in that an aluminum resistive layer 213 is formed in substitution for the aluminum resistive layer 207 in the semiconductor device according to the twelfth embodiment. The width Wb of the central portion of aluminum resistive layer 213 is wider than the width Wa of the both end portions. Aluminum resistive layer 213 is shaped with the planar shape of type polysilicon resistive layer 206c of FIG. 28. By employing aluminum resistive layer 213 in substitution for n-type polysilicon resistive layer 206c, and by widening the spacing between aluminum resistive layer 213 and semiconductor substrate 200, the parasitic resistance is reduced more than by the structure of FIG. 28. Since the potential distortion described with reference to FIG. 28 is relaxed by employing aluminum resistive layer 213, the breakdown voltage is prevented from lowering even when the width of the thin film field plate (the width Wb of the aluminum resistive layer) is widened.

The exposed surface of semiconductor substrate 200 (the surface of semiconductor substrate 200 not covered by aluminum resistive layer 213) is minimized, and the undesirable influence of ions caused by the mold resin sealing the semiconductor chip is suppressed by widening the aluminum resistive layer 213 on semiconductor substrate 200 in the semicircular portion.

Figure 30A:
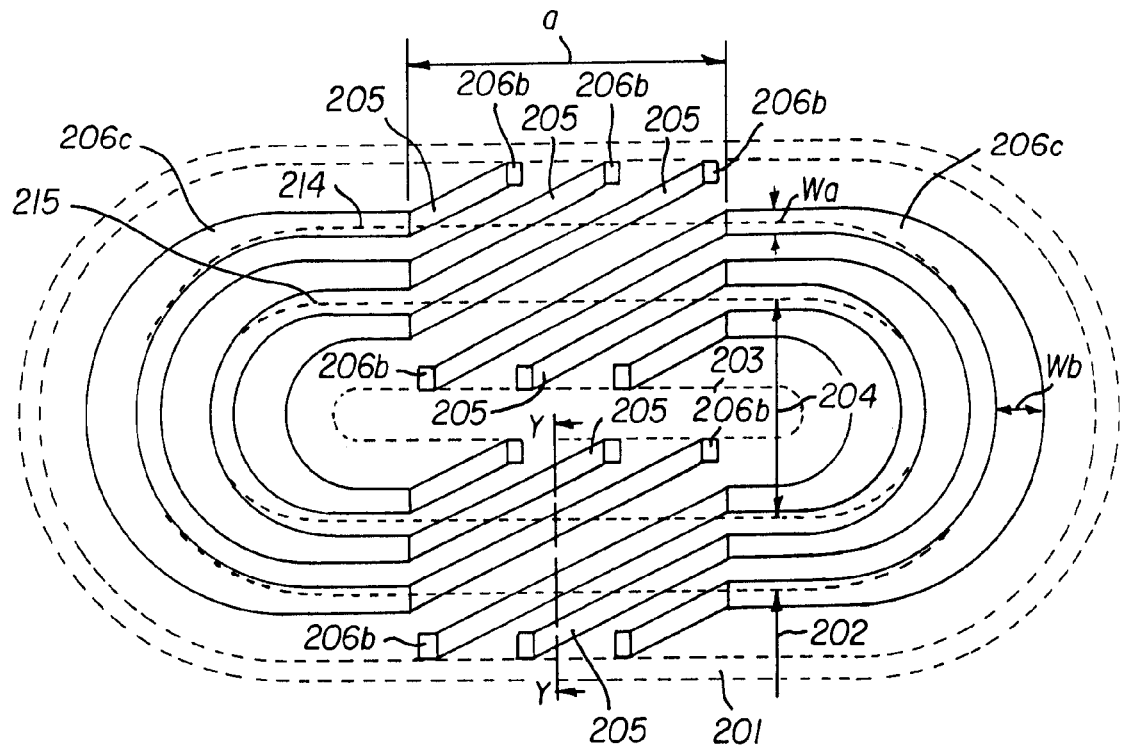
FIG. 30(a) is a top plan view of a semiconductor device according to a thirteenth embodiment of the invention.
Figure 30B:
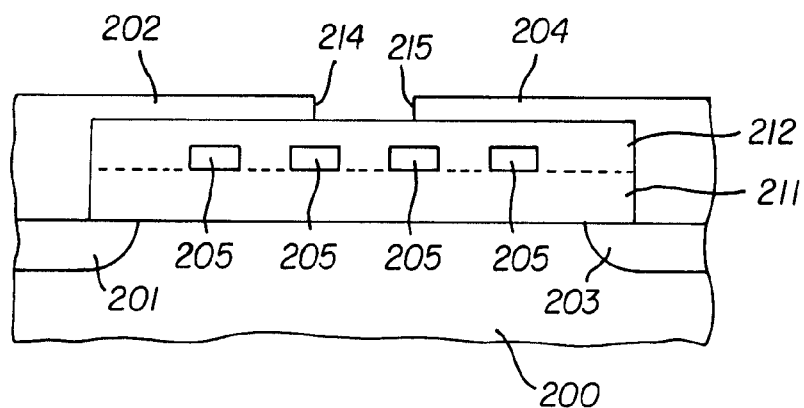
FIG. 30(b) is a cross sectional view of a main part of the semiconductor device of FIG. 30(a).

FIG. 30(a) is a top plan view of a semiconductor device according to a thirteenth embodiment of the invention. FIG. 30(b) is a cross sectional view of a main part of the semiconductor device of FIG. 30(a). The semiconductor device according to the thirteenth embodiment is different from the semiconductor device according to the eleventh embodiment shown in FIG. 28 in that a source electrode 202 and a drain electrode 204 are extended widely from a source region 201 and a drain region 203, respectively, above n-type polysilicon resistive layers 206c and thin films of pn-diodes 205 in the semiconductor device according to the thirteenth embodiment. In the figure, there are shown an inner circumferential edge 214 of source electrode 202 and an outer circumferential edge 215 of drain electrode 204.

Since the potential distribution in semiconductor substrate 200 (the potential distribution in the bulk) is corrected by the thin film field plate, the potential distribution in semiconductor substrate 200 is not affected by source electrode 202 and drain electrode 204. Due to this, the initial spacing between source electrode 202 and drain electrode 204 may be shortened to 2 micrometers in the device of the 700 V class. From the view point of securing sufficient reliability, the estimated desirable spacing between source electrode 202 and drain electrode 204 is 7 micrometers considering the life of the passivation film buried between the electrodes. The configuration described above facilitates minimizing the influence of ions caused by the plastic mold.

Figure 31A:
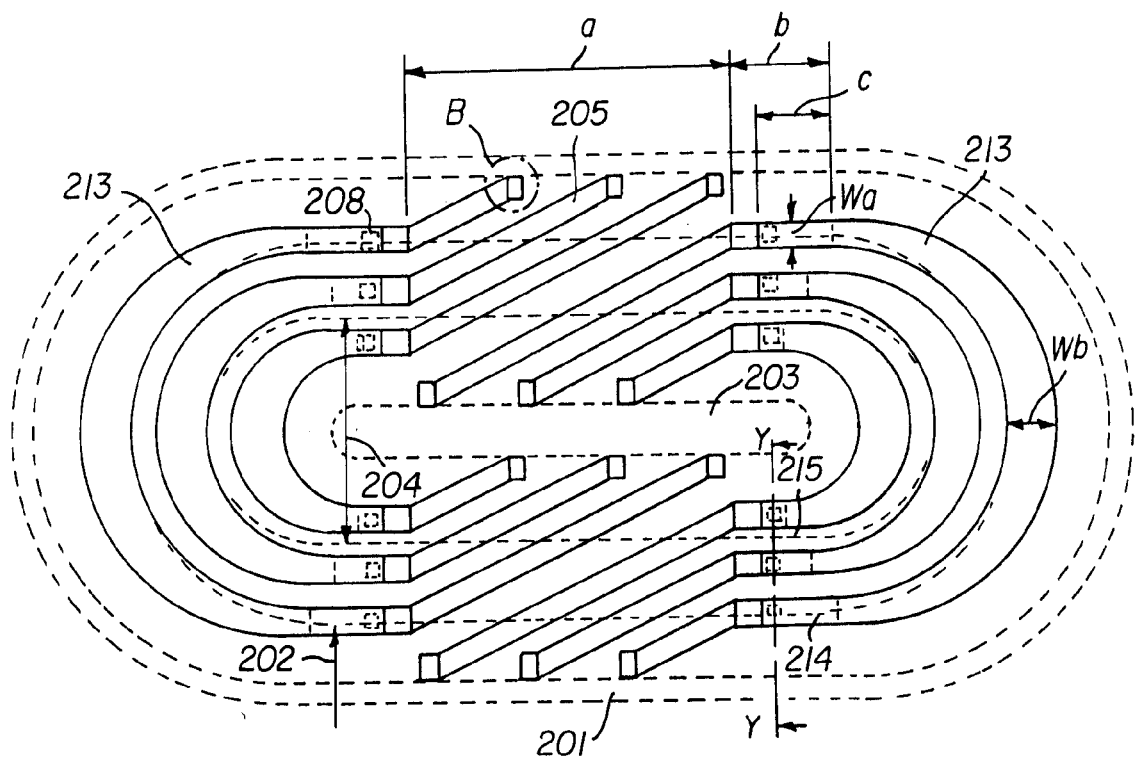
FIG. 31(a) is a top plan view of a semiconductor device according to a fourteenth embodiment of the invention.
Figure 31B:
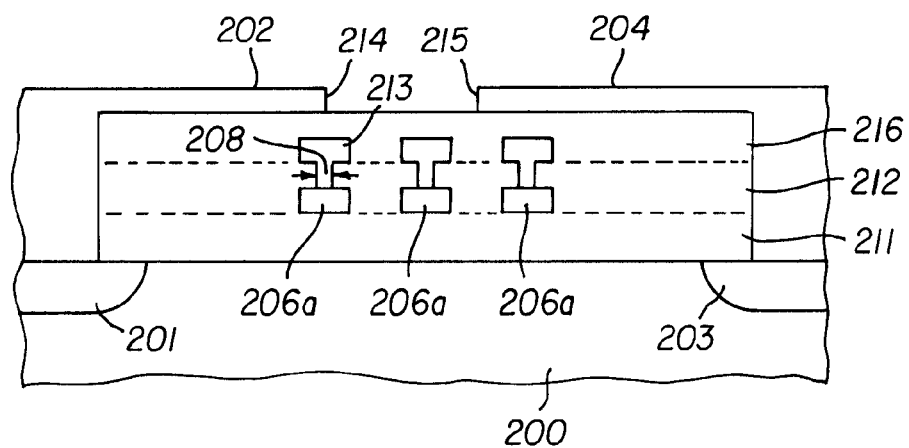
FIG. 31(b) is a cross sectional view of a main part of the semiconductor device of FIG. 31(a).

FIG. 31(a) is a top plan view of a semiconductor device according to a fourteenth embodiment of the invention. FIG. 31(b) is a cross sectional view of a main part of the semiconductor device of FIG. 31(a). The semiconductor device according to the fourteenth embodiment is different from the semiconductor device according to the twelfth embodiment shown in FIG. 29 in that a source electrode 202 and a drain electrode 204 are extended widely from a source region 201 and a drain region 203, respectively, above aluminum resistive layer 213 and thin films of pn-diodes 205 in the semiconductor device, according to the fourteenth embodiment. The semiconductor device according to the fourteenth embodiment exhibits the same effects with those of the semiconductor device according to the thirteenth embodiment.

Figure 32A:
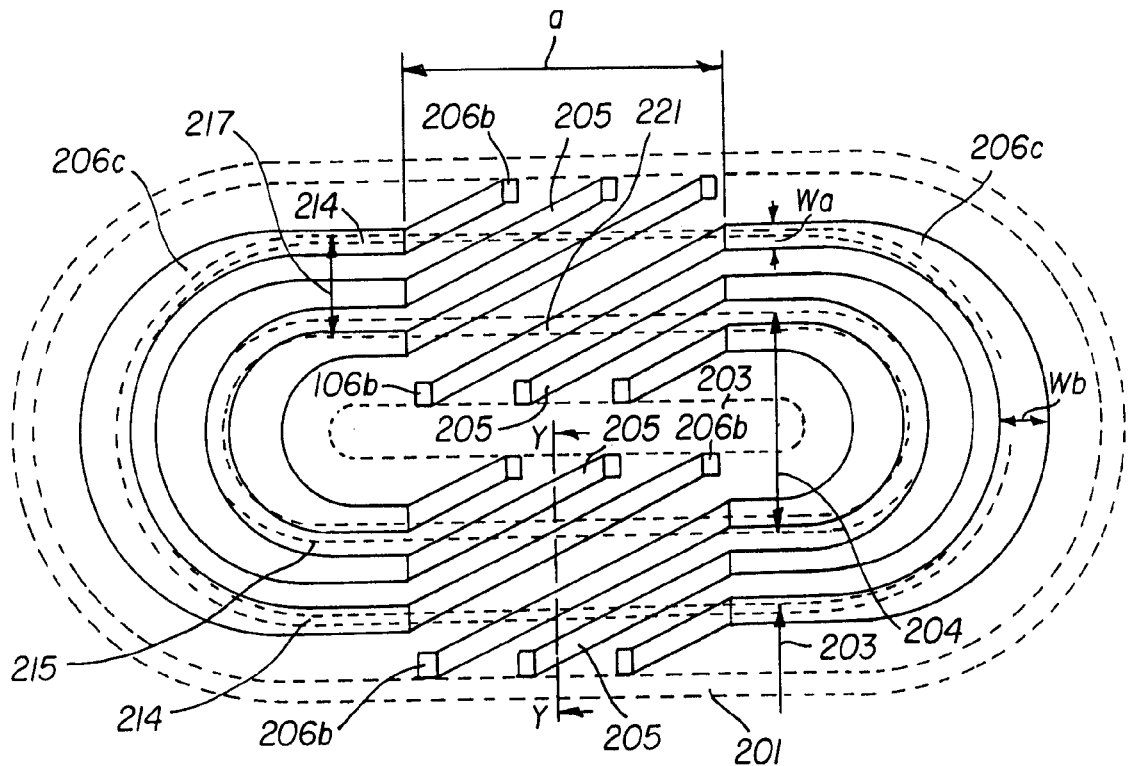
FIG. 32(a) is a top plan view of a semiconductor device according to a fifteenth embodiment of the invention.
Figure 32B:
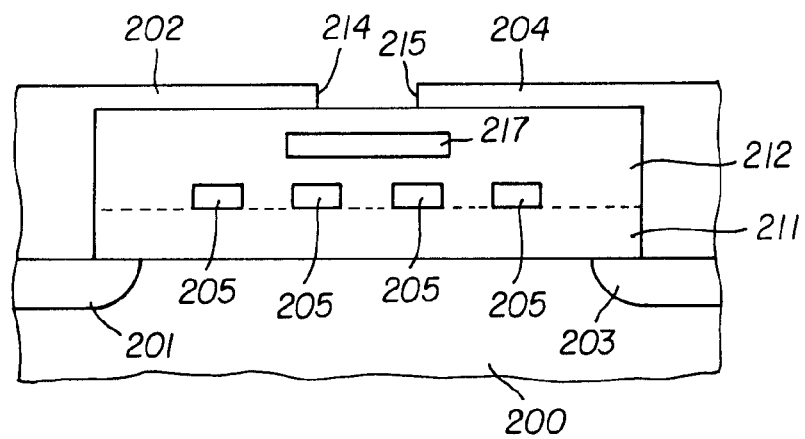
FIG. 32(b) is a cross sectional view of a main part of the semiconductor device of FIG. 32(a).

FIG. 32(a) is a top plan view of a semiconductor device according to a fifteenth embodiment of the invention. FIG. 32(b) is a cross sectional view of a main part of the semiconductor device of FIG. 32(a). The semiconductor device according to the fifteenth embodiment is different from the semiconductor device according to the thirteenth embodiment shown in FIGS. 30(a) and 30(b) in that an n-type polysilicon resistive layer 217 is formed in an interlayer insulation film 212, between the electrodes and 7 micrometers below (or above) the plane of the electrodes to completely shut off the influence of ions in the plastic mold in the semiconductor device according to the fifteenth embodiment. The polysilicon resistive layer may be of n-type. The n-type polysilicon resistive layer 217 may be replaced by an aluminum resistive layer. The potential of n-type polysilicon resistive layer 217 may be floated, as shown in FIG. 32(b), or fixed at an intermediate potential of the thin film field plate by connecting n-type polysilicon resistive layer 217 to the thin film field plate via a connection hole.

A saturation current flows through thin film of pn-diodes 205, and a current through n-type polysilicon resistive layer 206c, when a reverse bias voltage is applied between the source and the drain. Since the region between source electrode 202 and drain electrode 204 are covered with n-type polysilicon resistive layer 217 shaped with a planar ring, an almost uniform potential gradient is obtained in the thin film field plate by the saturation current of thin film of pn-diodes 205 and the current of n-type polysilicon resistive layer 206c. As a result, the potential on the side of semiconductor substrate 200 is almost equal to the potential of n-type polysilicon resistive layer 217, and a stable breakdown voltage is obtained.

Since the n-type polysilicon resistive layer 217 exhibits a shielding effect against disturbances such as ions and electric charges in the plastic mold of the semiconductor device, variation of the breakdown voltage is hardly caused even when high voltage is applied at a high temperature. The reliability of the device is therefore improved.

Figure 33A:
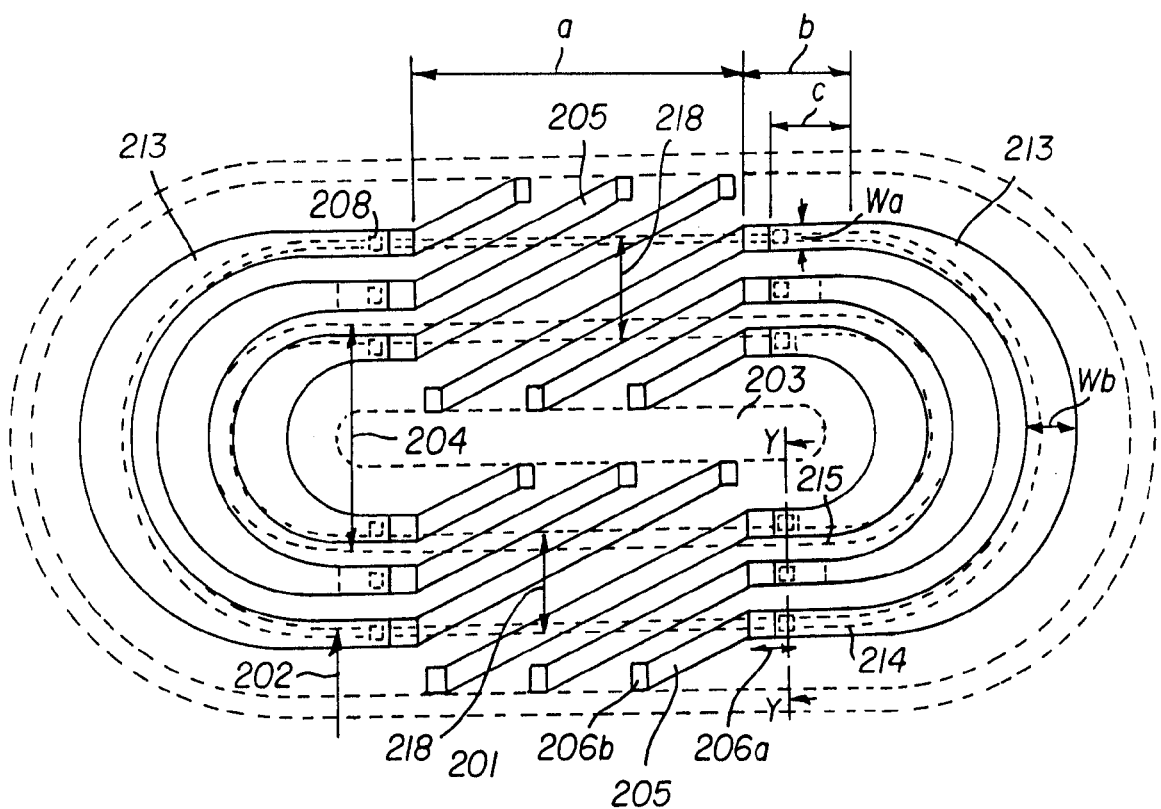
FIG. 33(a) is a top plan view of a semiconductor device according to a sixteenth embodiment of the invention.
Figure 33B:
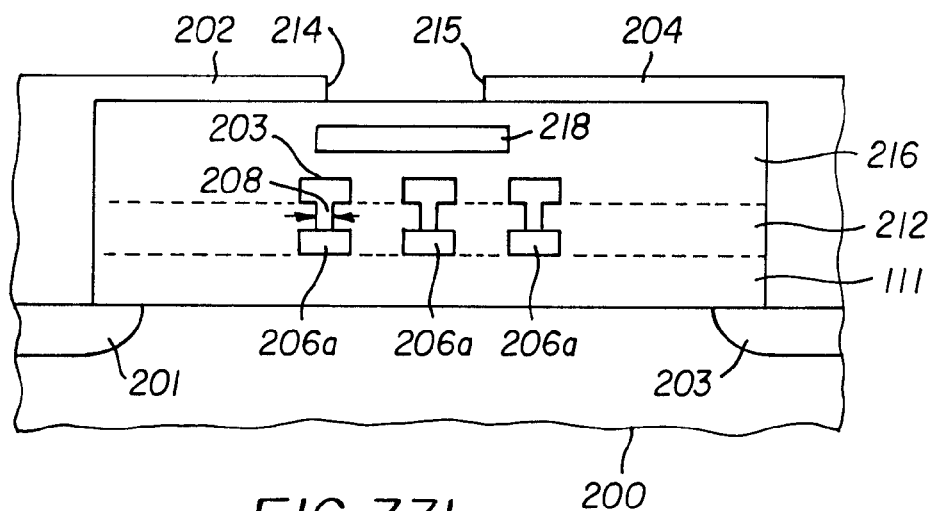
FIG. 33(b) is a cross sectional view of a main part of the semiconductor device of FIG. 33(a).

FIG. 33(a) is a top plan view of a semiconductor device according to a sixteenth embodiment of the invention. FIG. 33(b) is a cross sectional view of a main part of the semiconductor device of FIG. 33(a). The semiconductor device according to the sixteenth embodiment is different from the semiconductor device according to the fourteenth embodiment shown in FIGS. 31(a) and 31(b) in that an n-type polysilicon resistive layer 218 is formed in an interlayer insulation film 216, between the electrodes and 7 micrometers below (or above) the plane of the electrodes to completely shut off the undesirable influences of ions in the plastic mold in the semiconductor device according to the sixteenth embodiment. The polysilicon resistive layer 218 may be of p-type. The n-type polysilicon resistive layer 218 may be replaced by an aluminum resistive layer. The potential of n-type polysilicon resistive layer 218 may be floated, as shown in FIG. 33(b), or fixed at an intermediate potential of the thin film field plate by connecting n-type polysilicon resistive layer 218 to the thin film field plate via a connection hole. The semiconductor device according to the sixteenth embodiment exhibits the same effects with those of the semiconductor device according to the fifteenth embodiment.

Figure 34B:
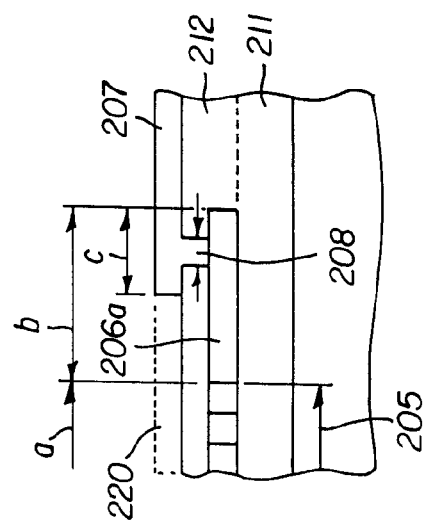
FIG. 34(b) is a cross sectional view of a main part of the semiconductor device of FIG. 34(a).
Figure 34A:
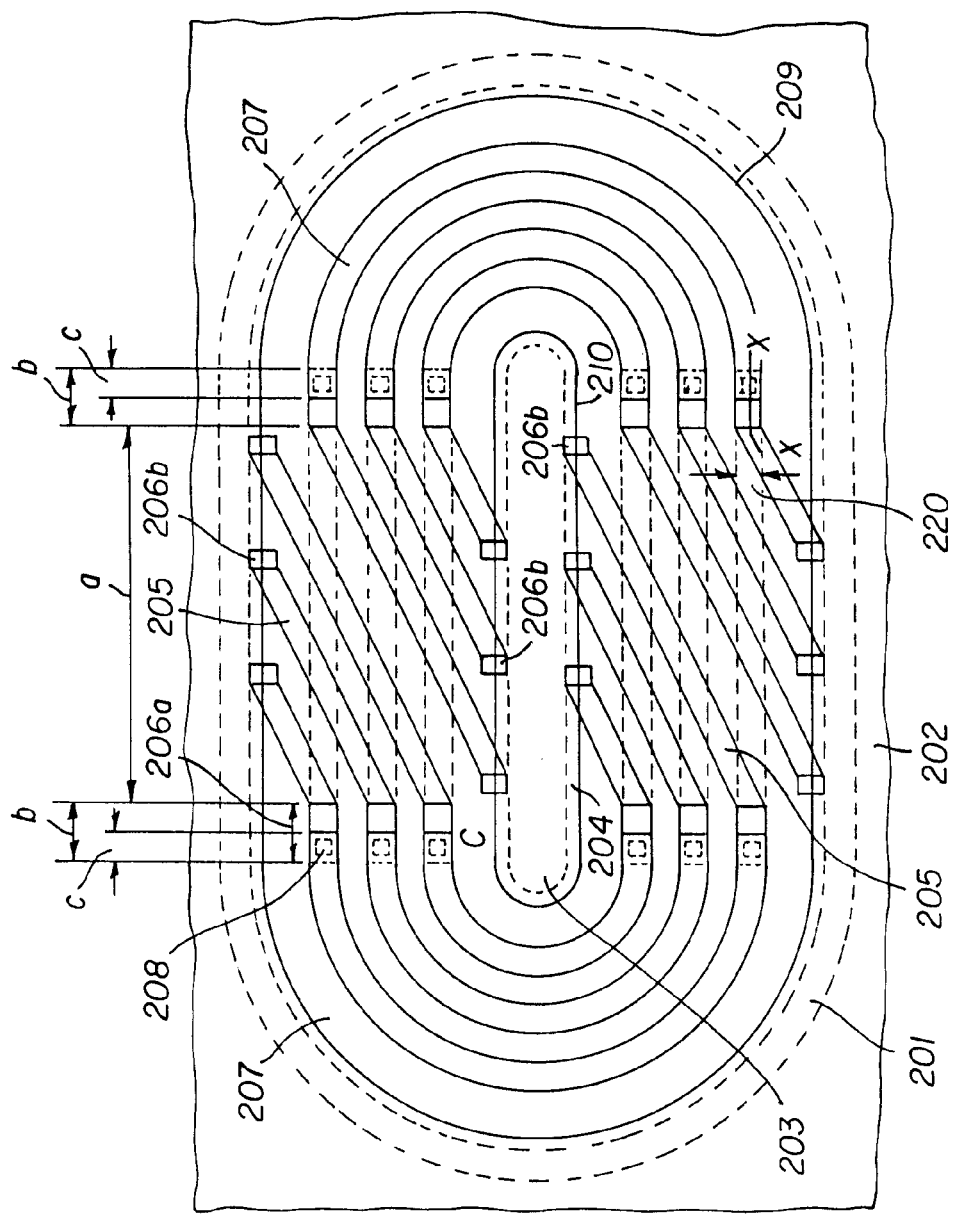
FIG. 34(a) is a top plan view of a semiconductor device according to a seventeenth embodiment of the invention.

FIG. 34(a) is a top plan view of a semiconductor device according to a seventeenth embodiment of the invention. FIG. 34(b) is a cross sectional view of a main part of the semiconductor device of FIG. 34(a). The semiconductor device according to the seventeenth embodiment is different from the semiconductor device according to the tenth embodiment shown in FIGS. 27(a), 27(b) and 27(c) in that two aluminum resistive layers 207 are connected with each other via two aluminum resistive layers 220, such that two aluminum resistive layers 207 and the two aluminum resistive layer 220 form a ring. Additional aluminum resistive layer 220 reduces the influence of the ions in the plastic mold more effectively than the semiconductor device according to the tenth embodiment. The configuration according to the seventeenth embodiment is applicable to the semiconductor devices shown in FIG. 29, FIGS. 31(a), 31(b) and FIGS. 33(a), 33(b).

As explained so far, the saturation current of the pn-diodes and/or the current flowing through the resistor, caused when a reverse bias voltage is applied between the source electrode and the drain electrode, facilitates obtaining an almost uniform potential gradient in the spiral thin film formed on the field oxide film between the source electrode and the drain electrode, equalizing the local potential of the substrate with the local potential of the spiral thin film and obtaining a stable breakdown voltage. Moreover, since the spiral thin film exhibits shield effects against disturbances such as ions and electric charges in the plastic mold of the semiconductor device, deviations of the breakdown voltage are hardly caused even when high voltage is applied at a high temperature.

Since the spiral polysilicon thin film works as a field plate, the impurity concentration in the p-type offset region, which increases on-resistance, may be lower than the optimum concentration, and then a certain breakdown voltage is secured without provision of the polysilicon thin film. Since the resistance of the n-type offset region, which provides a main current path in the ON-state of the semiconductor device, is substantially reduced, the on-resistance of the semiconductor device is reduced. In detail, as FIGS. 22 and 23 indicate, the on-resistance may be reduced by about 40%. Since the area of the power MOSFET may be reduced by about 40% for the same on-resistance values, the costs of the semiconductor device are greatly reduced.

The drain electrode may not necessarily be shaped with an ellipsoid. For example, a drain electrode shaped with a palm including fingers exhibits the same effects.

High speed switching of the semiconductor device is facilitated and the initial breakdown voltage in the semicircular portion of the device is prevented from lowering by disposing a thin film field plate formed of thin films of pn-diodes, n-type polysilicon resistive layers and an aluminum resistive layer; by widening the semicircular section of the aluminum resistive layer; and by positioning the aluminum resistive layer away from the semiconductor substrate. The undesirable influence of ions in the plastic mold is shut off, and the reliability of the breakdown voltage of the device is improved by extending aluminum electrode layers from the source region and the drain region and by disposing a shield layer, such as an aluminum resistive layer and a polysilicon resistive layer, in the space between the source electrode and the drain electrode.

The switching characteristics of the semiconductor device are improved by reducing the parasitic capacitance and the parasitic resistance. The breakdown voltage in the semicircular portion is prevented from lowering by expanding the spacing between the source electrode and the drain electrode. The influence of the ions in the plastic mold is suppressed also by extending the source electrode and the drain electrode to the side of the thin film field plate or by disposing a thin resistive layer for shielding between the source electrode and the drain electrode.

The semiconductor device according to the invention is also applicable to a monolithic power IC that integrates a power MOSFET and a control circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed:

1. A semiconductor device having a MIS structure, the semiconductor device comprising:
   a semiconductor substrate of a first conductivity type;
   a base region of the first conductivity type formed selectively in the surface portion of the semiconductor substrate;
   a lightly doped offset region of a second conductivity type formed selectively in the surface portion of the semiconductor substrate;
   a heavily doped source region of the second conductivity type formed selectively in the surface portion of the base region;
   a heavily doped drain region of the second conductivity type formed selectively in the surface portion of the offset region;
   a gate insulation film at least on the extended portion of the base region extended between the source region and the offset region;
   a gate electrode on the gate insulation film;
   a source electrode on the source region;
   a drain electrode on the drain region;
   a field insulation film formed selectively on the offset region; and
   a spiral thin film on the field insulation film, an end of the spiral thin film being connected to the drain electrode, another end of the spiral thin film being connected to the source electrode, the spiral thin film being formed of multiple pn-diodes connected in series, the spiral thin film surrounding the drain electrode, the spiral thin film comprising a thin film resistor branching from the midpoint of the series connection of the pn-diodes, the thin film resistor being formed along the drain electrode and the source electrode.

2. A semiconductor device having a MIS structure, the semiconductor device comprising:
   a semiconductor substrate of a first conductivity type;
   a lightly doped offset region of a second conductivity type formed selectively in the surface portion of the semiconductor substrate;
   a base region of the first conductivity type formed selectively in the surface portion of the offset region;
   a heavily doped drain region of the second conductivity type formed selectively in the surface portion of the offset region, the drain region being spaced apart from the base region;
   a source region of the second conductivity type formed selectively in the surface portion of the base region;
   a gate insulation film at least on the extended portion of the base region extended between the source region and the offset region;
   a gate electrode on the gate insulation film;
   a source electrode on the source region;
   a drain electrode on the drain region;
   a field insulation film formed selectively on the offset region; and
   a spiral thin film on the field insulation film, an end of the spiral thin film being connected to the drain electrode, another end of the spiral thin film being connected to the source electrode, the spiral thin film being formed of multiple pn-diodes connected in series, the spiral thin film surrounding the drain electrode, the spiral thin film comprising a thin film resistor branching from the midpoint of the series connection of the pn-diodes, the thin film resistor being formed along the drain electrode and the source electrode.

3. The semiconductor device according to claim 1, wherein the thin film resistor employs the p-type layer or the n-type layer of the pn-diodes.

4. The semiconductor device according to claim 2, wherein the thin film resistor employs the p-type layer or the n-type layer of the pn-diodes.

5. A semiconductor device having a MIS structure, the semiconductor device comprising:
   a semiconductor substrate of a first conductivity type;
   a base region of the first conductivity type formed selectively in the surface portion of the semiconductor substrate;
   a lightly doped offset region of a second conductivity type formed selectively in the surface portion of the semiconductor substrate;
   a heavily doped source region of the second conductivity type formed selectively in the surface portion of the base region;
   a heavily doped drain region of the second conductivity type formed selectively in the surface portion of the offset region;
   a gate insulation film at least on the extended portion of the base region extended between the source region and the offset region;
   a gate electrode on the gate insulation film;
   a source electrode on the source region;
   a drain electrode on the drain region;
   a field insulation film formed selectively on the offset region;
   a first thin film comprising pn-diodes connected in series;
   a first thin resistive layer; and
   a second thin film comprising pn-diodes connected in series;
   the source electrode surrounding the drain electrode or the drain electrode surrounding the source electrode;
   an end of the first thin film being connected to the source electrode;
   another end of the first thin film being connected to an end of the first thin resistive layer;
   another end of the first thin resistive layer being connected to an end of the second thin film; and
   another end of the second thin film being connected to the drain electrode.

6. The semiconductor device according to claim 5, the semiconductor device further comprising an interlayer insulation film and connection holes; the interlayer insulation film being on the first thin film and the second thin film; the first thin resistive layer being on the interlayer insulation film; the connection holes being bored through the interlayer insulation film on intermediate ones of the pn-diodes in the first thin film and the second thin film; the intermediate ones of the pn-diodes in the first thin film and the second thin film being connected to the first thin resistive layer through the connection holes; and the first thin resistive layer being formed along the source electrode or the drain electrode.

7. The semiconductor device according to claim 5, wherein the source electrode includes an extended portion extending from the source region, the drain electrode includes an extended portion extending from the drain region, the extended portions of the source electrode and the drain electrode are above the first thin resistive layer, the one end of the first thin film is connected to the source electrode in the vicinity of the source region, and the other end of the second thin film is connected to the drain electrode in the vicinity of the drain region.

8. The semiconductor device according to claim 5, wherein the first thin resistive layer comprises polysilicon with low electrical resistance.

9. The semiconductor device according to claim 5, wherein the first thin resistive layer comprises an aluminum resistive film.

10. The semiconductor device according to claim 5, the semiconductor device further comprising an interlayer insulation film and a second thin resistive layer; the interlayer insulation film being on the first thin film and the second thin film and on the first thin resistive layer; the source electrode and the drain electrode being on the interlayer insulation film; and the second thin resistive layer being in the portion of the interlayer insulation film between the source electrode and the drain electrode.

11. The semiconductor device according to claim 10, wherein the source electrode includes an extended portion extended from the source region, the drain electrode includes an extended portion extending from the drain region, the extended portions of the source electrode and the drain electrode are above the second thin resistive layer, the one end of the first thin film is connected to the source electrode in the vicinity of the source region, and the other end of the second thin film is connected to the drain electrode in the vicinity of the drain region.

12. The semiconductor device according to claim 10, the semiconductor device further comprising connection holes, through which the second thin resistive layer is connected to the first thin film and the second thin film or to the first thin resistive layer.

13. The semiconductor device according to claim 5, wherein the side face of the source electrode comprises straight sections and semicircular sections; the side face of the drain electrode comprises straight sections and semicircular sections; the straight sections of the source electrode and the straight sections of the drain electrode are facing opposite each other; the semicircular sections of the source electrode and the semicircular sections of the drain electrode are facing opposite each other; the first thin resistive layer comprises a semicircular section between the semicircular section of the source electrode and the semicircular section of the drain electrode; and the width of the semicircular section of the first thin resistive layer in the central portion thereof is wider than the width of the semicircular section of the first thin resistive layer in the end portions thereof.

14. A semiconductor device having a MIS structure, the semiconductor device comprising:

a semiconductor substrate of a first conductivity type;

a base region of the first conductivity type formed selectively in the surface portion of the semiconductor substrate;

a lightly doped offset region of a second conductivity type formed selectively in the surface portion of the semiconductor substrate;

a heavily doped source region of the second conductivity type formed selectively in the surface portion of the base region;

a heavily doped drain region of the second conductivity type formed selectively in the surface portion of the offset region;

a gate insulation film at least on the extended portion of the base region extended between the source region and the offset region;

a gate electrode on the gate insulation film;

a source electrode on the source region;

a drain electrode on the drain region;

a field insulation film formed selectively on the offset region;

a first thin film comprising pn-diodes connected in series;

a thin resistive layer; and a second thin film comprising pn-diodes connected in series;

the source electrode surrounding the drain electrode or the drain electrode surrounding the source electrode;

the thin resistive layer being between the source electrode and drain electrode, and the thin resistive layer turning around along the source electrode and the drain electrode;

an end of the first thin film being connected to the source electrode;

another end of the first thin film being connected to a first location of the thin resistive layer;

an end of the second thin film being connected to a second location of the thin resistive layer; and another end of the second thin film being connected to the drain electrode.

15. The semiconductor device according to claim 14, wherein the side face of the source electrode comprises straight sections and semicircular sections; the side face of the drain electrode comprises straight sections and semicircular sections; the thin resistive layer comprises straight sections and semicircular sections; the straight sections of the source electrode and the straight sections of the drain electrode are facing opposite each other; the semicircular sections of the source electrode and the semicircular sections of the drain electrode are facing opposite each other; the semicircular section of the thin resistive layer is between the semicircular section of the source electrode and the semicircular section of the drain electrode; and the width of the semicircular sections of the thin resistive layer in the central portion thereof is wider than the width of the semicircular sections of the thin resistive layer in the end portions thereof.

16. The semiconductor device according to claim 14, wherein the thin resistive layer comprises polysilicon with low electrical resistance.

17. The semiconductor device according to claim 14, wherein the thin resistive layer comprises an aluminum resistive film.

18. The semiconductor device according to claim 5, wherein the source electrode includes an extended portion extending from the source region, the drain electrode includes an extended portion extending from the drain region, the extended portions of the source electrode and the drain electrode are above the first thin resistive layer, the one end of the first thin film is connected to a gate electrode, and the other end of the second think film is connected to the drain electrode in the vicinity of the drain region.

19. The semiconductor device according to claim 10, wherein the source electrode includes an extended portion extending from the source region, the drain electrode includes an extended portion extending from the drain region, the extended portions of the source electrode and the drain electrode are above the first thin resistive layer, the one end of the first thin film is connected to a gate electrode, and the other end of the second think film is connected to the drain electrode in the vicinity of the drain region.

* * * * *